United States Patent
Fujita et al.

(10) Patent No.: US 9,735,171 B2
(45) Date of Patent: Aug. 15, 2017

(54) SEMICONDUCTOR MEMORY DEVICE AND METHOD OF MANUFACTURING THE SAME

(71) Applicant: Kabushiki Kaisha Toshiba, Minato-ku (JP)

(72) Inventors: Junya Fujita, Nagoya (JP); Fumiki Aiso, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/071,465

(22) Filed: Mar. 16, 2016

(65) Prior Publication Data
US 2017/0018568 A1    Jan. 19, 2017

Related U.S. Application Data

(60) Provisional application No. 62/192,356, filed on Jul. 14, 2015.

(51) Int. Cl.
| | | |
|---|---|---|
| H01L 27/115 | (2017.01) | |
| H01L 27/11582 | (2017.01) | |
| H01L 27/1157 | (2017.01) | |

(52) U.S. Cl.
CPC .... H01L 27/11582 (2013.01); H01L 27/1157 (2013.01)

(58) Field of Classification Search
CPC ........... H01L 27/11582; H01L 27/1157; H01L 27/11519; H01L 27/11556; H01L 27/11565
See application file for complete search history.

(56) References Cited

U.S. PATENT DOCUMENTS

| | | | |
|---|---|---|---|
| 8,148,769 B2 | 4/2012 | Kito et al. | |
| 8,148,789 B2 | 4/2012 | Kito et al. | |
| 2011/0233648 A1 | 9/2011 | Seol et al. | |
| 2013/0119456 A1* | 5/2013 | Kito | H01L 29/7926 257/324 |
| 2013/0334593 A1 | 12/2013 | Seol et al. | |
| 2014/0070304 A1* | 3/2014 | Komiya | H01L 21/764 257/326 |
| 2014/0138761 A1* | 5/2014 | Yagishita | H01L 29/66825 257/326 |
| 2015/0311301 A1 | 10/2015 | Seol et al. | |

FOREIGN PATENT DOCUMENTS

| | | |
|---|---|---|
| JP | 2010-80561 | 4/2010 |
| JP | 2011-211200 | 10/2011 |
| JP | 5148242 | 2/2013 |

* cited by examiner

*Primary Examiner* — Thanh V Pham
(74) *Attorney, Agent, or Firm* — Oblon, McClelland, Maier & Neustadt, L.L.P.

(57) ABSTRACT

According to an embodiment, a semiconductor memory device includes a plurality of control gate electrodes, a semiconductor layer, and a charge accumulation layer. The plurality of control gate electrodes are provided as a stack above a substrate. The semiconductor layer has as its longitudinal direction a direction crossing the substrate, and faces the plurality of control gate electrodes. The charge accumulation layer is positioned between the control gate electrode and the semiconductor layer. A gap is provided between the semiconductor layer and a lower end portion of the charge accumulation layer.

12 Claims, 34 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/192,356, filed on Jul. 14, 2015, the entire contents of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment includes a plurality of control gate electrodes, a semiconductor layer, and a charge accumulation layer. The plurality of control gate electrodes are provided as a stack above a substrate. The semiconductor layer has as its longitudinal direction a direction crossing the substrate, and faces the plurality of control gate electrodes. The charge accumulation layer is positioned between the control gate electrode and the semiconductor layer. A gap is provided between the semiconductor layer and a lower end portion of the charge accumulation layer.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a structure in which a memory string extends linearly in a direction crossing a substrate, but a similar structure may be applied also to a U-shaped structure in which the memory string is doubled back on an opposite side midway. Moreover, each of the drawings of the nonvolatile semiconductor memory devices employed in the embodiments below is schematic, and thicknesses, widths, ratios, and so on, of layers are different from those of the actual nonvolatile semiconductor memory devices.

In addition, the nonvolatile semiconductor memory devices described below relate to nonvolatile semiconductor memory devices having a structure in which a plurality of MONOS (Metal-Oxide-Nitride-Oxide-Semiconductor) type memory cells (memory transistors) are provided in a height direction, each of the MONOS type memory cells including: a semiconductor layer acting as a channel body provided in a column shape crossing a substrate; and a control gate electrode layer made of metal provided on a side surface of the semiconductor layer via a charge accumulation layer. However, this is also not intended to limit the present invention, and the present invention may be applied also to another form of charge accumulation layer, for example, a structure including a SONOS (Semiconductor-Oxide-Nitride-Oxide-Semiconductor) type memory cell that includes a control gate electrode made of a semiconductor, or a structure including a floating gate type memory cell.

First Embodiment

Semiconductor Memory Device

Figure 1:
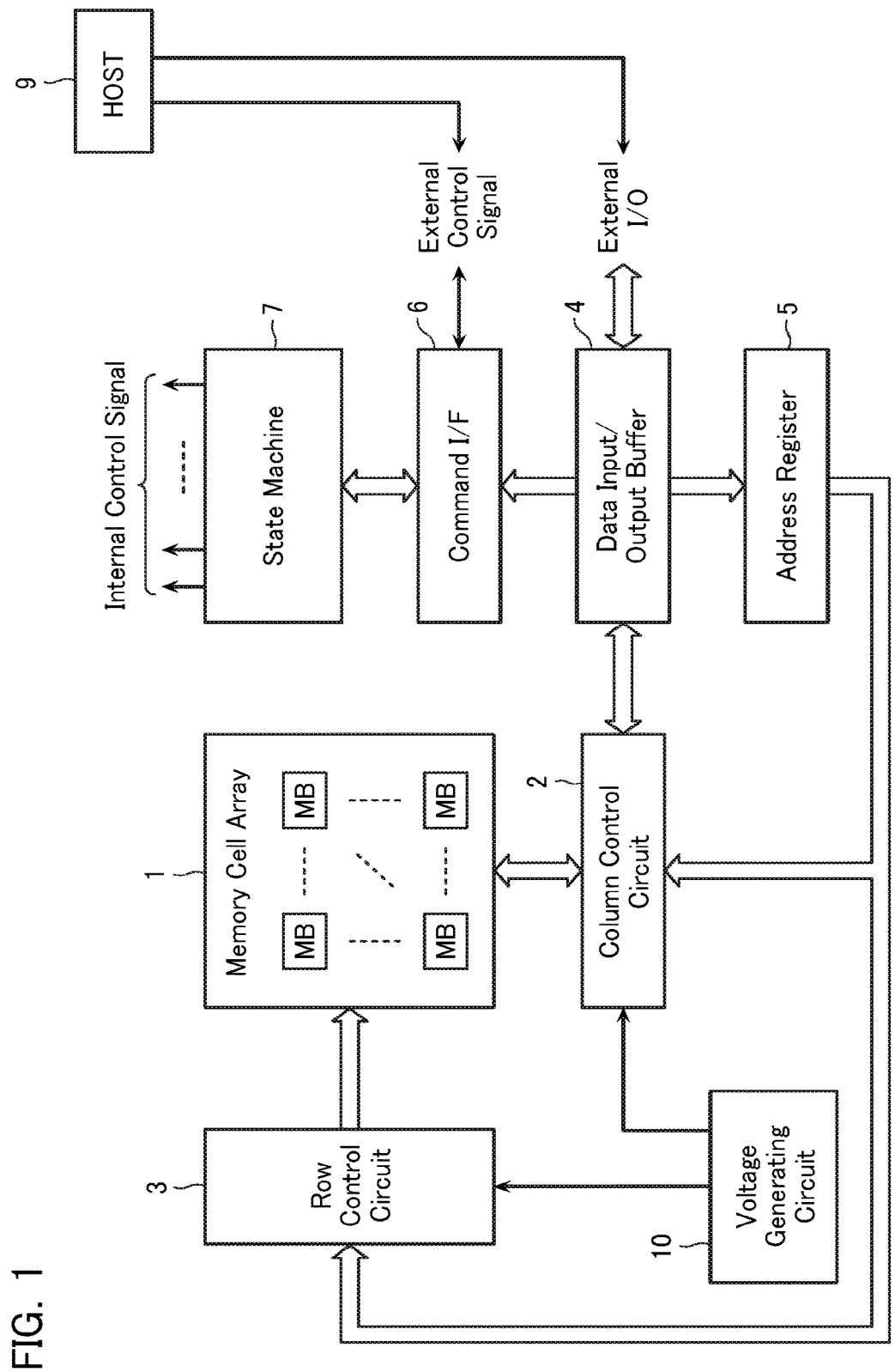
FIG. 1 is a block diagram of a nonvolatile semiconductor memory device according to a first embodiment.

FIG. 1 is a block diagram of a nonvolatile semiconductor memory device according to a first embodiment. The same nonvolatile semiconductor memory device stores user data inputted from an external host 9, in a certain address in a memory cell array 1. In addition, the same nonvolatile semiconductor memory device reads user data from a certain address in the memory cell array 1, and outputs the user data to the external host 9.

That is, as shown in FIG. 1, the same nonvolatile semiconductor memory device includes the memory cell array 1 that stores user data. The memory cell array 1 includes a plurality of memory blocks MB. As will be described later with reference to FIG. 2, these memory blocks MB each include: a plurality of memory cells MC; and a plurality of bit lines BL and a plurality of word lines WL connected to these memory cells MC.

As shown in FIG. 1, the same nonvolatile semiconductor memory device includes a column control circuit 2 provided in a periphery of the memory cell array 1. When performing write of user data, the column control circuit 2 transfers a voltage generated by a voltage generating circuit 10 to a desired bit line BL, according to the inputted user data. Moreover, the column control circuit 2 includes an unillustrated sense amplifier, and when performing read of user data, detects a voltage or potential of a certain bit line BL.

As shown in FIG. 1, the same nonvolatile semiconductor memory device includes a row control circuit 3 provided in a periphery of the memory cell array 1. The row control circuit 3 transfers a voltage generated by the voltage generating circuit 10 to a desired word line WL, and so on, according to inputted address data.

As shown in FIG. 1, the same nonvolatile semiconductor memory device includes an address register 5 that supplies address data to the column control circuit 2 and the row control circuit 3. The address register 5 stores address data inputted from a data input/output buffer 4.

As shown in FIG. 1, the same nonvolatile semiconductor memory device includes the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the same nonvolatile semiconductor memory device includes the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the same nonvolatile semiconductor memory device includes the data input/output buffer 4 which is connected to the external host 9 via an I/O line. The data input/output buffer 4 receives write data from the external host 9, and transfers the write data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives read data from the column control circuit 2, and transfers the read data to the external host 9.

As shown in FIG. 1, the same nonvolatile semiconductor memory device includes the command interface 6 that receives an external control signal from the external host 9. The command interface 6 determines which of user data, command data, and address data inputted to the data input/output buffer 4 is, based on the external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
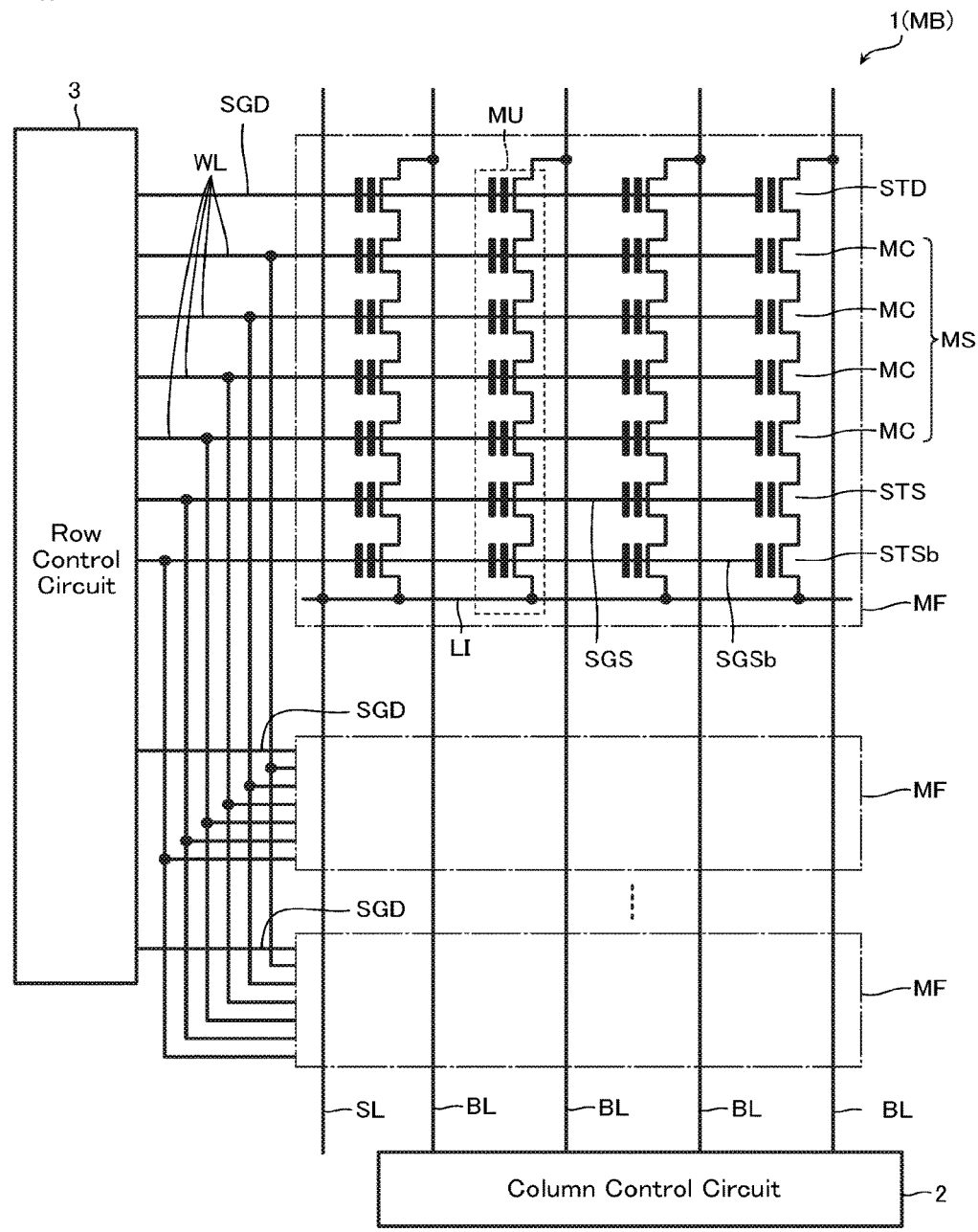
FIG. 2 is a circuit diagram showing a configuration of part of the same nonvolatile semiconductor memory device.

Next, a circuit configuration of part of the memory cell array 1 according to the present embodiment will be described with reference to FIG. 2. FIG. 2 is an equivalent circuit diagram showing a configuration of the memory block MB configuring the memory cell array 1.

As shown in FIG. 2, the memory block MB includes a plurality of the memory cells MC. The memory cells MC each store a one-bit portion or a multiple-bit portion of data configuring the above-mentioned user data. Moreover, in the memory block MB shown in FIG. 2, a certain drain side select gate line SGD and a certain word line WL are selected by the row control circuit 3, whereby a certain number of the memory cells MC are selected. These selected memory cells MC each have a bit line BL connected thereto, and a current or voltage of these bit lines BL attains a different magnitude according to data recorded in the memory cell MC. The column control circuit 2 determines data recorded in the plurality of memory cells MC by detecting the current or voltage of this bit line BL, and outputs this data as user data.

As shown in FIG. 2, the memory blocks MB each include a plurality of memory fingers MF. Commonly connected to these plurality of memory fingers MF are a plurality of the bit lines BL and a source line SL. Each of the memory fingers MF is connected to the column control circuit 2 via the bit lines BL, and is connected to an unillustrated source line driver via the source line SL.

The memory finger MF includes a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU includes a plurality of the memory cells MC connected in series. As will be mentioned later, the memory cell MC includes: a semiconductor layer functioning as a channel body; a charge accumulation layer; and a control gate electrode. Moreover, the memory cell MC accumulates a charge in the charge accumulation layer based on a voltage applied to the control gate electrode, and changes a control gate voltage (threshold voltage) for rendering the channel body in a conductive state. Hereafter, the plurality of memory cells MC connected in series will be called a "memory string MS". The row control circuit 3 transfers a voltage to a certain word line WL, thereby transferring this voltage to the control gate electrode of a certain memory cell MC in the memory string MS.

As shown in FIG. 2, commonly connected to the control gate electrodes of pluralities of the memory cells MC configuring different memory strings MS are, respectively, the word lines WL. These pluralities of memory cells MC are connected to the row control circuit 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU includes a drain side select gate transistor STD connected between the memory string MS and the bit line BL. Connected to a control gate of the drain side select gate transistor STD is the drain side select gate line SGD. The drain side select gate line SGD is connected to the row control circuit 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row control circuit 3 selects a certain drain side select gate line SGD, thereby selectively connecting all of the memory strings MS in a certain memory finger MF to the bit lines BL.

Moreover, as shown in FIG. 2, the memory unit MU includes a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row control circuit 3 connects all of the memory strings MS in the memory block MB to the source line SL, based on an inputted signal.

Figure 3:
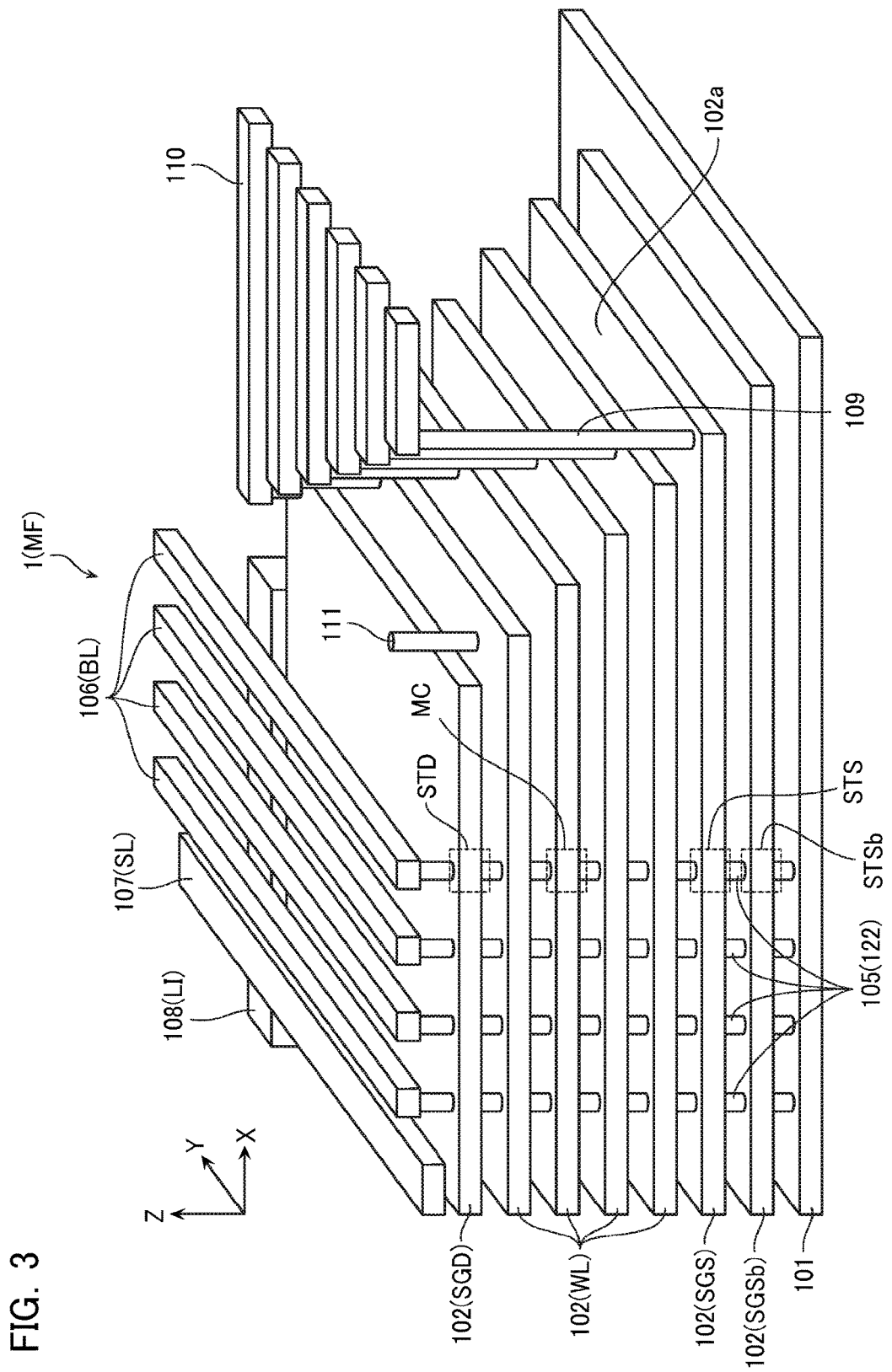
FIG. 3 is a perspective view showing a configuration of part of the same nonvolatile semiconductor memory device.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, the configuration shown in FIG. 3 is merely an example, and a specific configuration may be appropriately changed.

As shown in FIG. 3, the memory finger MF includes: a substrate 101; and a plurality of conductive layers 102 stacked in a Z direction above the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as each of the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

As shown in FIG. 3, the plurality of conductive layers 102 are formed in steps, at their ends in an X direction. That is, the conductive layer 102 includes a contact portion 102a that does not face a lower surface of the conductive layer 102 positioned in a layer above it. Moreover, the conductive layer 102 is connected to a via contact wiring line 109 at this contact portion 102a. Moreover, a wiring line 110 is provided at an upper end of the via contact wiring line 109. Note that the via contact wiring line 109 and the wiring line 110 are configured from a conductive layer of the likes of tungsten.

In addition, as shown in FIG. 3, the memory finger MF includes a support 111. The support 111 communicates with holes provided in the plurality of conductive layers 102. The support 111 supports a posture of an unillustrated insulating layer provided between the conductive layers 102, in a manufacturing step.

In addition, as shown in FIG. 3, the memory finger MF includes a conductive layer 108. The conductive layer 108 faces side surfaces in a Y direction of the plurality of conductive layers 102, and has a plate-like shape extending in the X direction and the Z direction. Moreover, a lower end of the conductive layer 108 contacts the substrate 101. The conductive layer 108 is configured from a conductive layer of the likes of tungsten (W), for example, and functions as the source contact LI.

In addition, as shown in FIG. 3, the memory finger MF includes a plurality of conductive layers 106 and a conductive layer 107 that are positioned upwardly of the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 4:
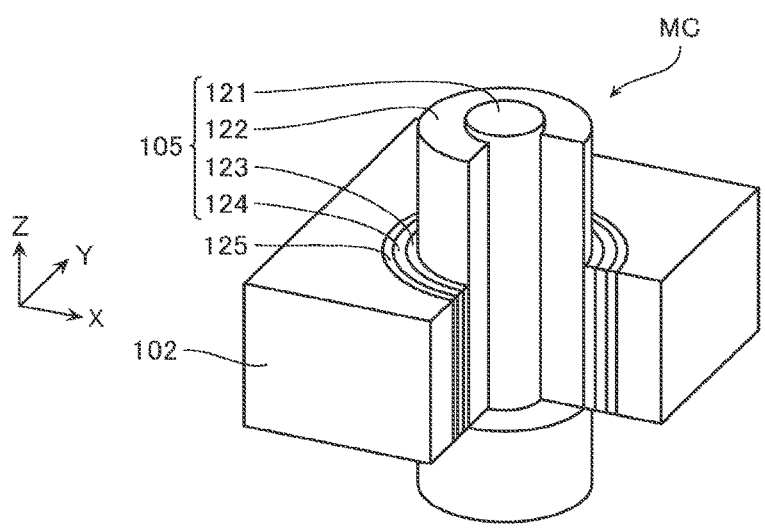
FIG. 4 is a perspective view showing a configuration of part of the same nonvolatile semiconductor memory device.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 includes: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel body of the memory cell MC, the lowermost layer source side select gate transistor STSb, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example. The block insulating layer 125 is configured from an insulating layer of the likes of silicon oxide ($SiO_2$), for example.

Figure 5:
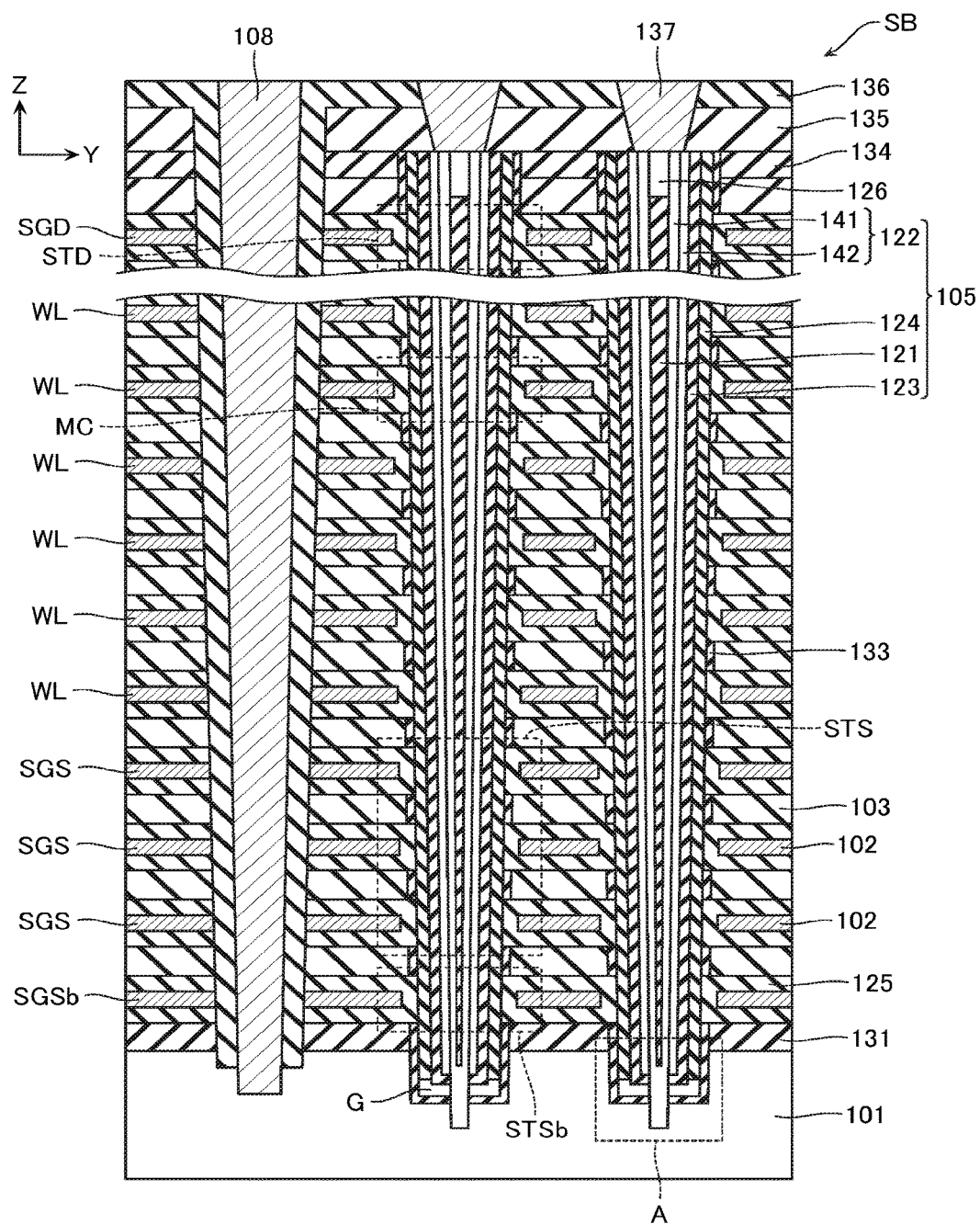
FIG. 5 is a cross-sectional view showing a configuration of part of the same nonvolatile semiconductor memory device.

Next, the nonvolatile semiconductor memory device according to the present embodiment will be described in more detail with reference to FIG. 5. FIG. 5 is a cross-sectional view showing a configuration of part of the same nonvolatile semiconductor memory device.

As shown in FIG. 5, the nonvolatile semiconductor memory device according to the present embodiment includes: the substrate 101; a stacked body SB including a plurality of the conductive layers 102 provided above the substrate 101; the memory columnar body 105 extending in the Z direction; and the conductive layer 108 functioning as the source contact LI. The memory columnar body 105 is connected to the bit line BL via a bit line contact 137, and is connected to the source line SL via the substrate 101 and the conductive layer 108.

The stacked body SB will be described with reference to FIG. 5. The stacked body SB includes: a plurality of the conductive layers 102 and inter-layer insulating layers 103 provided alternately above the substrate 101; and the block insulating layer 125 that covers an upper surface, lower surface, and side surface of the conductive layer 102. The conductive layer 102 is formed from a conductive material of the likes of tungsten (W), for example.

As shown in FIG. 5, the plurality of conductive layers 102 function as the lowermost layer source side select gate line SGSb and control gate electrode of the lowermost layer source side select gate transistor STSb, the source side select gate line SGS and control gate electrode of the source side select gate transistor STS, the word line WL and control gate electrode of the memory cell MC, and the drain side select gate line SGD and control gate electrode of the drain side select gate transistor STD.

Next, the memory columnar body 105 will be described with reference to FIG. 5. As shown in FIG. 5, the memory columnar body 105 includes: the core insulating layer 121 extending in the Z direction; and the semiconductor layer 122, the tunnel insulating layer 123, and the charge accumulation layer 124 that sequentially cover the sidewall of the core insulating layer 121. Moreover, the semiconductor layer 122 includes: a first semiconductor layer 141 covering a side surface of the core insulating layer 121; and a second semiconductor layer 142 covering a side surface of this first semiconductor layer 141. The core insulating layer 121 is configured from an insulating material of the likes of silicon oxide ($SiO_2$), for example. The first semiconductor layer 141 and the second semiconductor layer 142 are configured from a semiconductor of the likes of polysilicon, for example, and function as the channel body of the memory cell MC, and so on. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example.

As shown in FIG. 5, the core insulating layer 121, the first semiconductor layer 141, the second semiconductor layer 142, the tunnel insulating layer 123, and the charge accumulation layer 124 have a columnar shape extending in the Z direction. Moreover, the first semiconductor layer 141 contacts the substrate 101 at a lower end of the first semiconductor layer 141.

In addition, part of the memory columnar body 105 is covered by a cover insulating layer 133. That is, as shown in FIG. 5, the cover insulating layer 133 covers a sidewall of part of the charge accumulation layer 124. Note that the cover insulating layer 133 is configured from an insulating layer of the likes of silicon oxide ($SiO_2$), for example.

Figure 6:
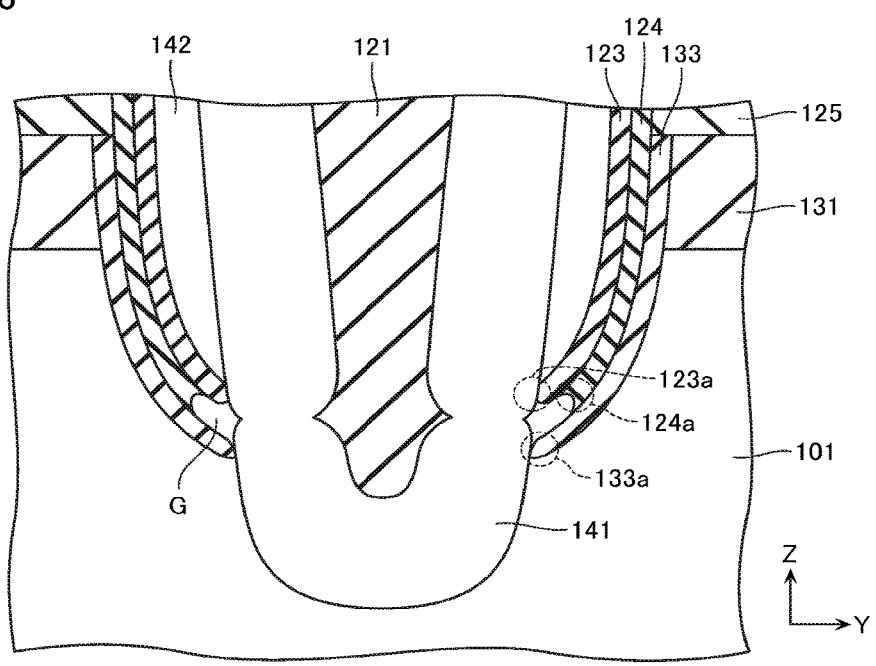
FIG. 6 is a cross-sectional view showing a configuration of part of the same nonvolatile semiconductor memory device.

Next, a configuration of a lower end of the memory columnar body 105 will be described with reference to FIG. 6. FIG. 6 is a cross-sectional view showing a configuration of part of the same nonvolatile semiconductor memory device, and shows an enlarged view of the portion indicated by A of FIG. 5.

As shown in FIG. 6, the lower end of the first semiconductor layer 141 is implanted in the substrate 101. Moreover, a side surface of the first semiconductor layer 141 is covered by the second semiconductor layer 142. Furthermore, the tunnel insulating layer 123, the charge accumulation layer 124, and the cover insulating layer 133 are provided between the second semiconductor layer 142 and the substrate 101. Note that the tunnel insulating layer 123, the charge accumulation layer 124, and the cover insulating layer 133 are provided along a side surface and lower surface of the second semiconductor layer 142.

Now, as shown in FIG. 6, in the present embodiment, a lower end portion 123a of the tunnel insulating layer 123 and a lower end portion 133a of the cover insulating layer 133 contact the first semiconductor layer 141. In contrast, a lower end portion 124a of the charge accumulation layer 124 is recessed with respect to the lower end portion 123a of the tunnel insulating layer 123 and the lower end portion 133a of the cover insulating layer 133, and does not contact the first semiconductor layer 141.

In addition, as shown in FIG. 6, in the present embodiment, a gap G is provided between the charge accumulation layer 124 and the first semiconductor layer 141. An upper end and a lower end of the gap G are positioned more downwardly than an upper surface of the substrate 101. Moreover, the gap G is provided in a space partitioned by a lower surface of the tunnel insulating layer 123, the lower end portion 124a of the charge accumulation layer 124, an upper surface of the cover insulating layer 133, and the side surface of the first semiconductor layer 141.

In addition, for example, an electrical resistance value, via the gap G, between the lower end portion 124a of the charge accumulation layer 124 and the first semiconductor layer 141 is adjusted so as to be not less than an electrical resistance value in a film thickness direction of the tunnel insulating layer 123. For example, a distance, via the gap G, between the lower end portion 124a of the charge accumulation layer 124 and the first semiconductor layer 141 is adjusted to not less than a distance electrically equivalent to the film thickness of the tunnel insulating layer 123.

[Semiconductor Memory Device According to Comparative Example]

Figure 7:
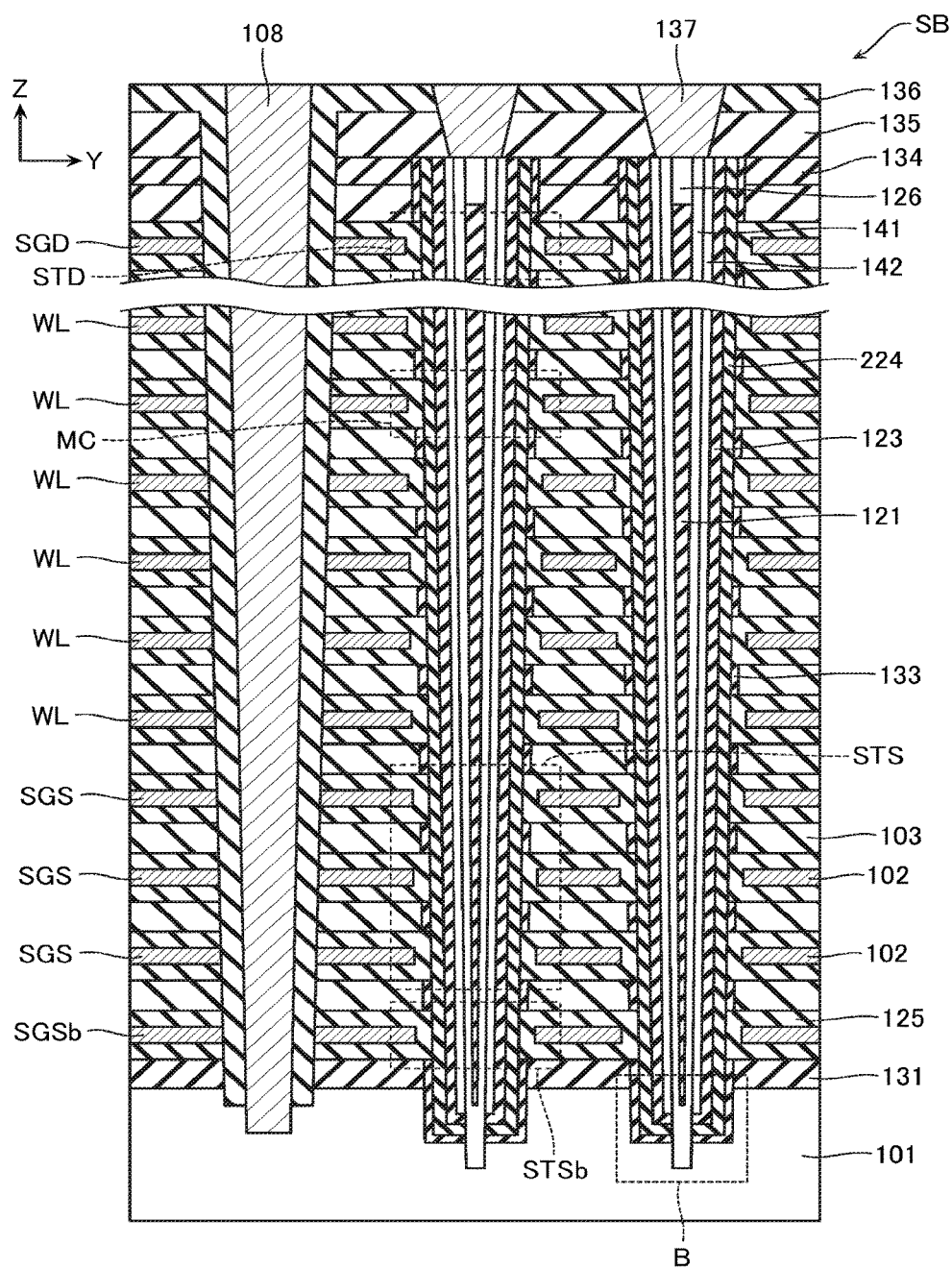
FIG. 7 is a cross-sectional view showing a configuration of part of a nonvolatile semiconductor memory device according to a comparative example.
Figure 8:
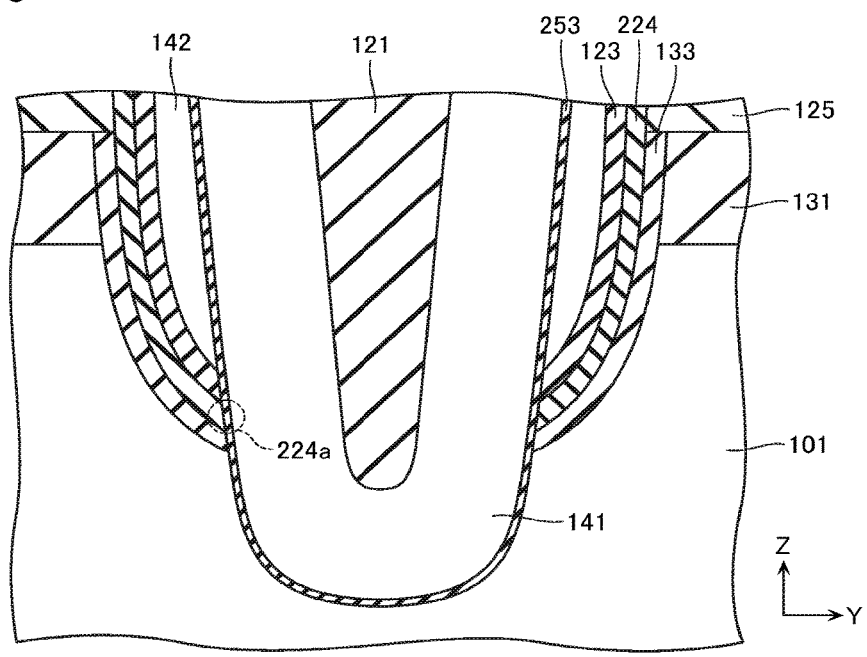
FIG. 8 is a cross-sectional view showing a configuration of part of the same nonvolatile semiconductor memory device.

Next, a configuration of a nonvolatile semiconductor memory device according to a comparative example will be described with reference to FIGS. 7 and 8. FIG. 7 is a cross-sectional view showing a configuration of part of the same nonvolatile semiconductor memory device. FIG. 8 is a cross-sectional view showing a configuration of part of the same nonvolatile semiconductor memory device, and shows an enlarged view of the portion indicated by B of FIG. 7. Note that in the description below, portions similar to those of the nonvolatile semiconductor memory device according to the first embodiment are assigned with identical reference symbols to those assigned in the first embodiment, and descriptions thereof will be omitted.

As shown in FIGS. 7 and 8, the nonvolatile semiconductor memory device according to the comparative example is basically configured similarly to the nonvolatile semiconductor memory device according to the first embodiment, but differs from the nonvolatile semiconductor memory device according to the first embodiment in the following points.

That is, as shown in FIG. 8, in the nonvolatile semiconductor memory device according to the comparative example, a natural oxide film 253 is formed on sidewalls of the substrate 101, the cover insulating layer 133, a charge accumulation layer 224, the tunnel insulating layer 123, and the second semiconductor layer 142.

Moreover, as shown in FIG. 8, in the nonvolatile semiconductor memory device according to the comparative example, a lower end portion 224a of the charge accumulation layer 224 contacts the first semiconductor layer 141 via the natural oxide film 253.

[Comparison of Semiconductor Devices]

Next, the nonvolatile semiconductor memory device according to the first embodiment and the nonvolatile semiconductor memory device according to the comparative example will be compared with reference to FIGS. 5 to 8.

As described with reference to FIG. 8, in the nonvolatile semiconductor memory device according to the comparative example, the lower end portion 224a of the charge accumulation layer 224 contacts the first semiconductor layer 141 via the natural oxide film 253. Now, the natural oxide film 253 does not have a film thickness of a degree enabling it to sufficiently insulate between the first semiconductor layer 141 and the charge accumulation layer 224. Therefore, sometimes, when the likes of a read operation is performed, a charge moves from the first semiconductor layer 141 to the lower end portion 224a of the charge accumulation layer 224, and the charge gets accumulated therein. Now, sometimes, when the charge got accumulated in the lower end portion 224a of the charge accumulation layer 224, the threshold voltage for rendering the substrate 101 or first semiconductor layer 141 in a conductive state ended up increasing and the first semiconductor layer 141 got electrically divided from the substrate 101.

Moreover, the lower end portion 224a of the charge accumulation layer 224 is comparatively separated from the conductive layer 102, and it is difficult for the lower end portion 224a of the charge accumulation layer 224 to be influenced by an electric field from the conductive layer 102. Therefore, if a charge gets accumulated in such a portion, it is difficult for the accumulated charge to be discharged.

In contrast, as described with reference to FIG. 6, in the nonvolatile semiconductor memory device according to the first embodiment, the lower end portion 124a of the charge accumulation layer 124 does not contact the first semiconductor layer 141. Therefore, a charge can be suitably prevented from accumulating in the lower end portion 124a of the charge accumulation layer 124, and the read operation can be suitably performed.

Moreover, as shown in FIG. 8, in the nonvolatile semiconductor memory device according to the comparative example, the natural oxide film 253 is formed between a first semiconductor layer 141 and the second semiconductor layer 142. Therefore, a resistance value between the first semiconductor layer 141 connected to the substrate 101 and the second semiconductor layer 142 operating mainly as the channel body of the memory cell MC, and so on, increases. Similarly, in the nonvolatile semiconductor memory device according to the comparative example, the natural oxide film 253 is formed also between the substrate 101 and the first semiconductor layer 141, and a resistance value therebetween also increases. Therefore, sometimes, a current flowing in the bit line BL during the read operation decreased.

In contrast, as shown in FIG. 6, in the nonvolatile semiconductor memory device according to the first embodiment, the natural oxide layer is not formed either between the first semiconductor layer 141 and the second semiconductor layer 142 or between the substrate 101 and the first semiconductor layer 141. Therefore, a decrease in bit line BL current during the read operation can be prevented.

[Method of Manufacturing]

Figure 9:
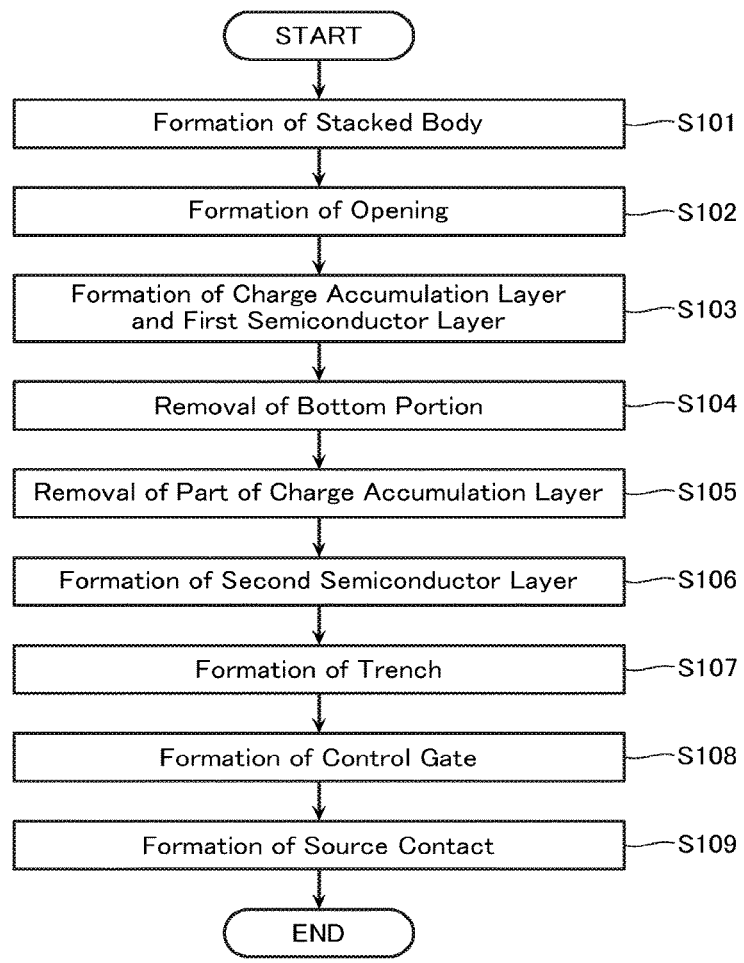
FIG. 9 is a flowchart showing a method of manufacturing the nonvolatile semiconductor memory device according to the first embodiment.

Next, a method of manufacturing the nonvolatile semiconductor memory device according to the first embodiment will be described with reference to FIGS. 9 to 29. FIG. 9 is a flowchart for explaining the same method of manufacturing. FIGS. 10 to 29 are cross-sectional views for explaining the same method of manufacturing.

Figure 10:
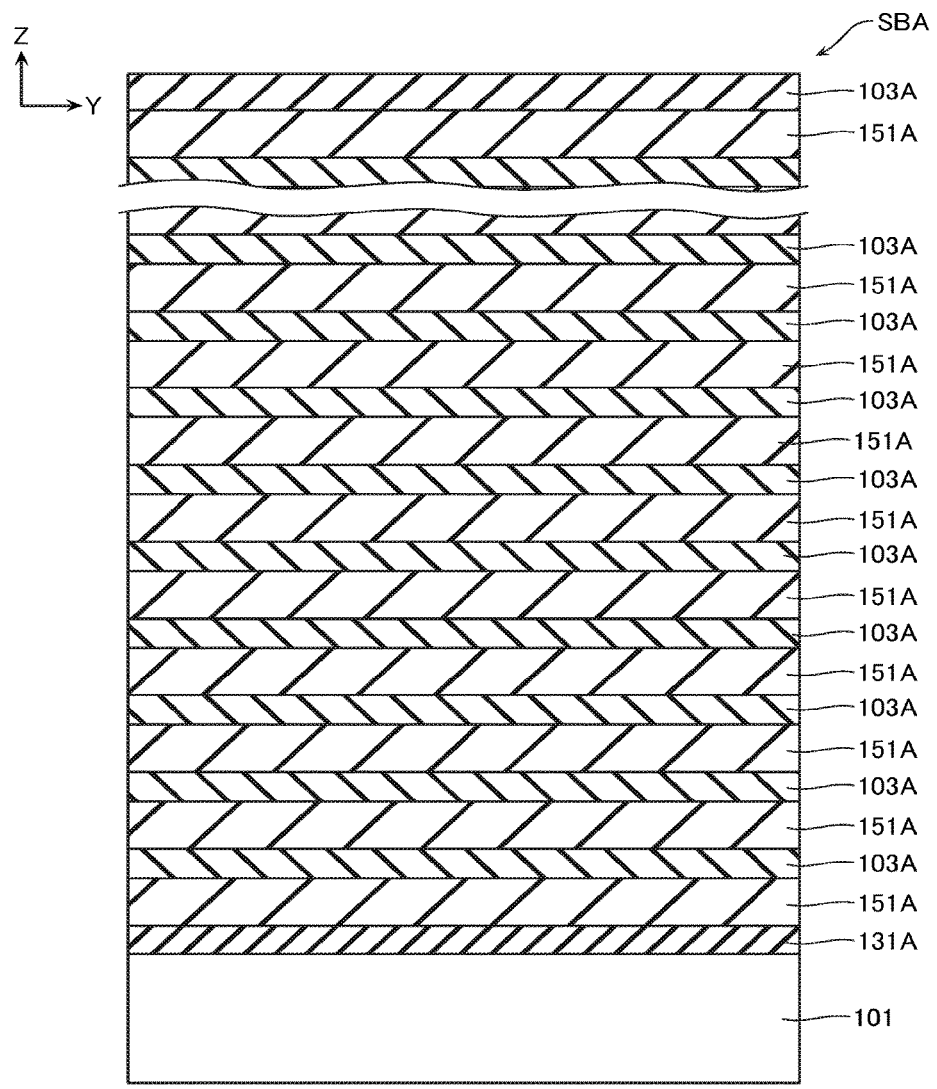
FIG. 10 is a cross-sectional view showing the same method of manufacturing.

As shown in FIGS. 9 and 10, in step S101, an insulating layer 131A is stacked above the substrate 101, and a plurality of layers of insulating layers 103A which will be the inter-layer insulating layers 103, and sacrifice layers 151A are alternately stacked to form a stacked body SBA. The insulating layer 131A and the insulating layer 103A are configured from silicon oxide ($SiO_2$), for example. Moreover, the sacrifice layer 151A is configured from silicon nitride (SiN), for example.

Figure 11:
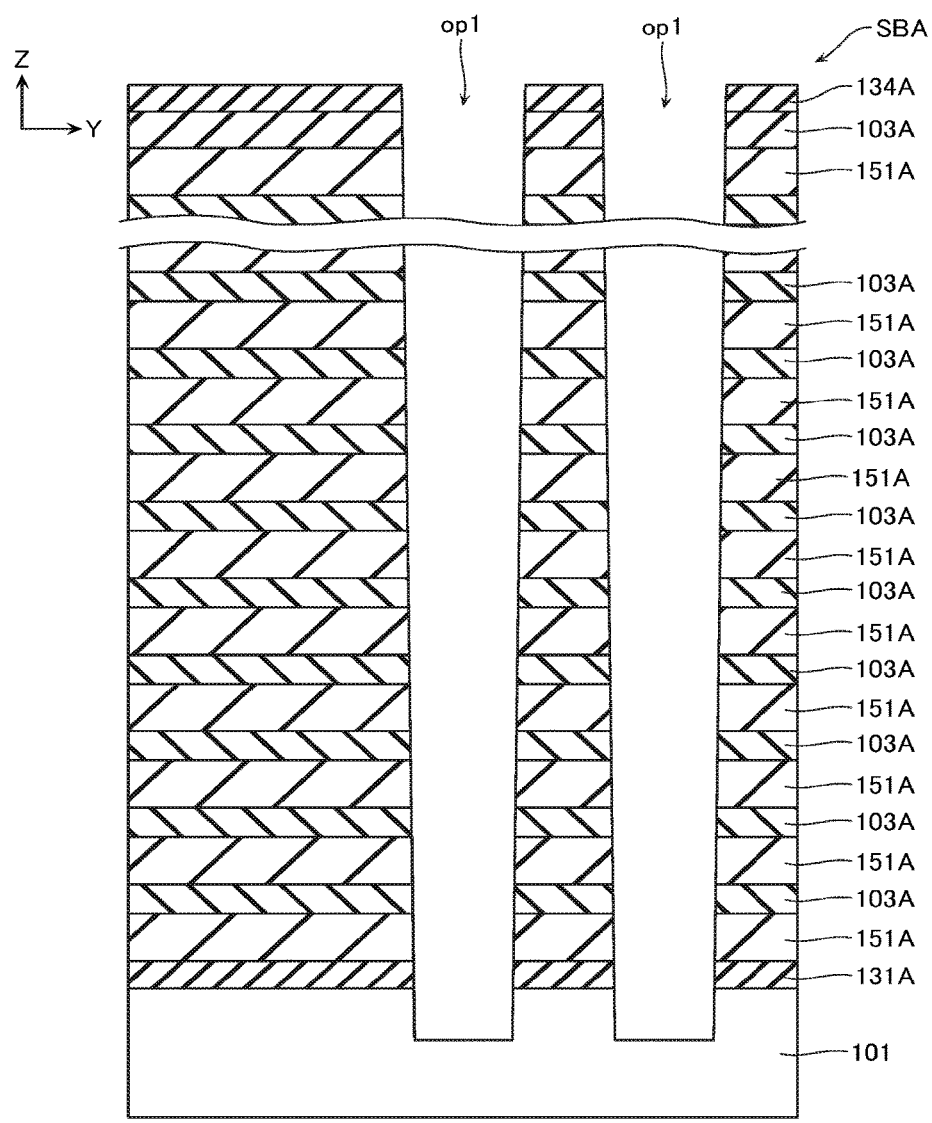
FIG. 11 is a cross-sectional view showing the same method of manufacturing.
Figure 12:
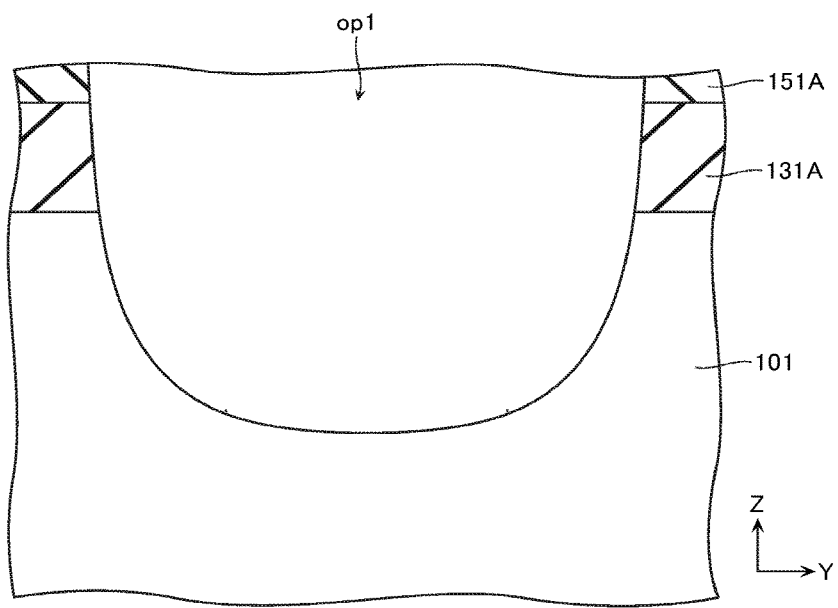
FIG. 12 is a cross-sectional view showing the same method of manufacturing.

As shown in FIGS. 9, 11, and 12, in step S102, an opening op1 is formed in the stacked body SBA. That is, first, an insulating layer 134A is formed above an upper surface of the stacked body SBA. A portion corresponding to the opening op1, of the insulating layer 134A is provided with an opening. Next, anisotropic etching such as RIE (Reactive Ion Etching) is performed using this insulating layer 134A as a mask, and the opening op1 is formed in the stacked body SBA. The opening op1 penetrates the insulating layer 131A and the plurality of insulating layers 103A and sacrifice layers 151A stacked above the insulating layer 131A.

Figure 13:
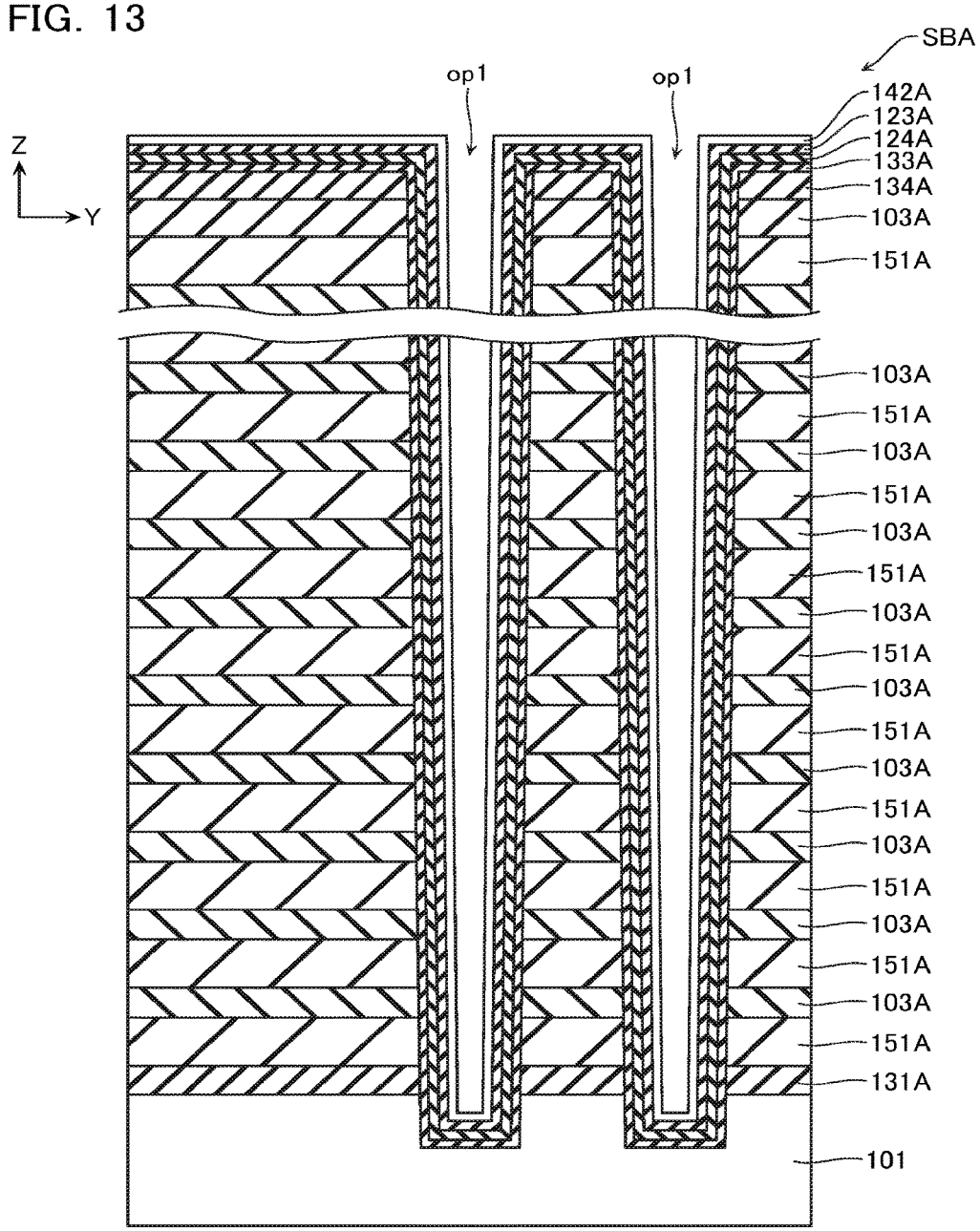
FIG. 13 is a cross-sectional view showing the same method of manufacturing.
Figure 14:
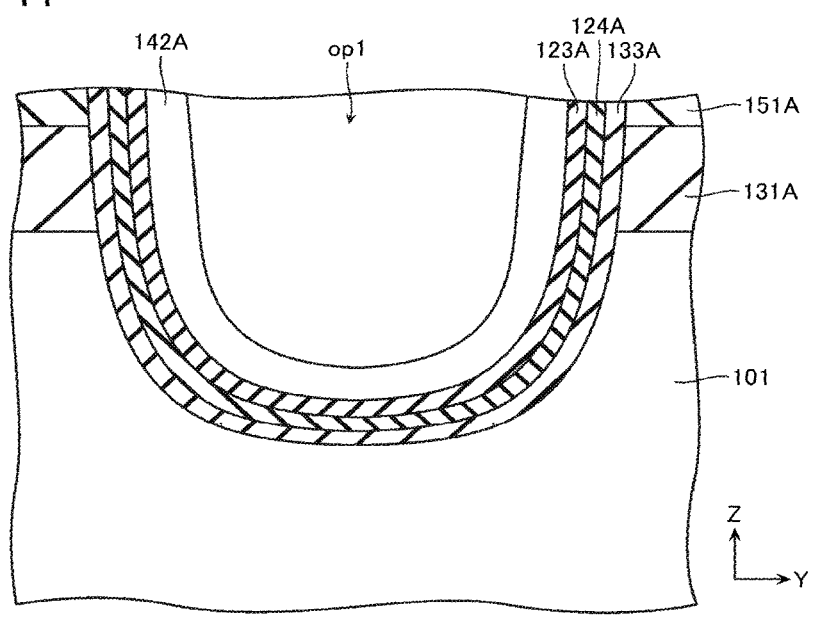
FIG. 14 is a cross-sectional view showing the same method of manufacturing.

As shown in FIGS. 9, 13, and 14, in step S103, an insulating layer 133A which will be the cover insulating layer 133, a charge accumulation layer 124A which will be the charge accumulation layer 124, an insulating layer 123A which will be the tunnel insulating layer 123, and a semiconductor layer 142A which will be the second semiconductor layer 142, are formed. The insulating layer 133A, the charge accumulation layer 124A, the insulating layer 123A, and the semiconductor layer 142A cover the upper surface of the stacked body SBA and an inner wall and bottom portion of the opening op1. Note that the insulating layer 133A and the insulating layer 123A are configured from silicon oxide (SiO$_2$), for example. Moreover, the charge accumulation layer 124A is configured from silicon nitride (SiN), for example. Moreover, the semiconductor layer 142A is configured from amorphous-state silicon, for example.

Figure 15:
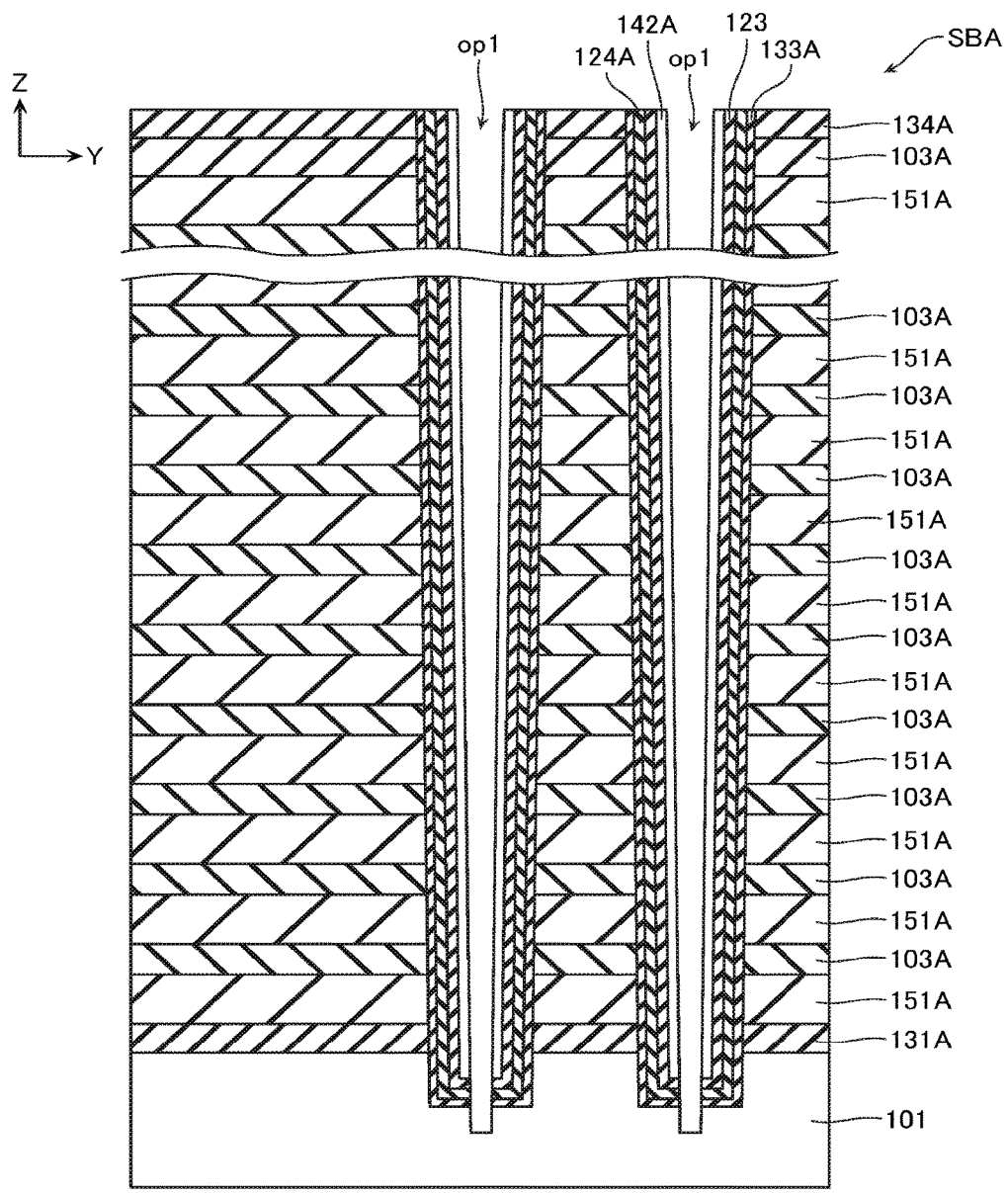
FIG. 15 is a cross-sectional view showing the same method of manufacturing.
Figure 16:
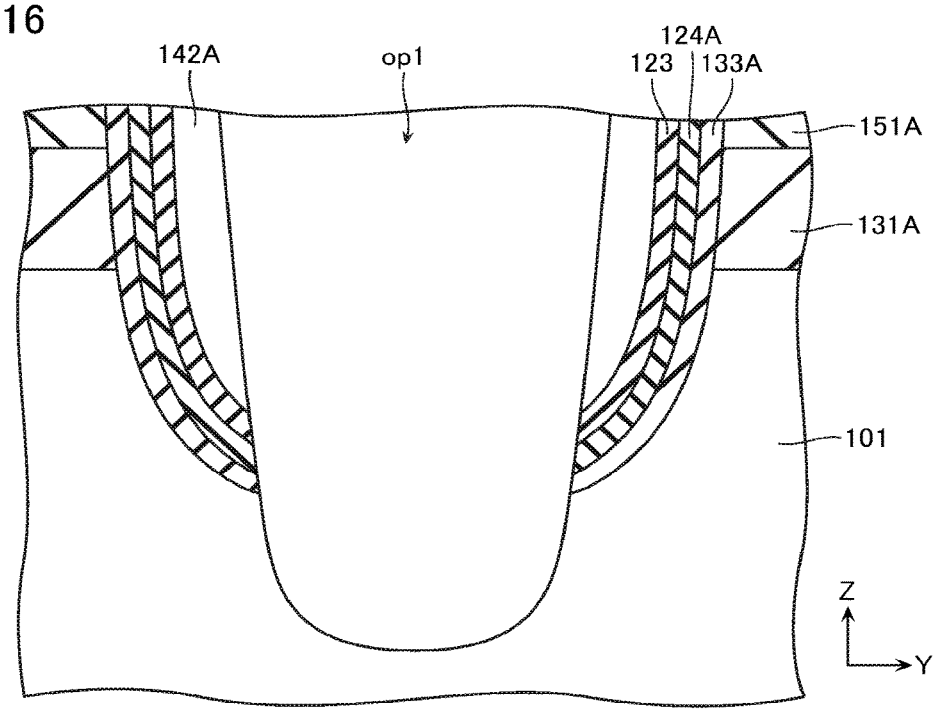
FIG. 16 is a cross-sectional view showing the same method of manufacturing.
Figure 17:
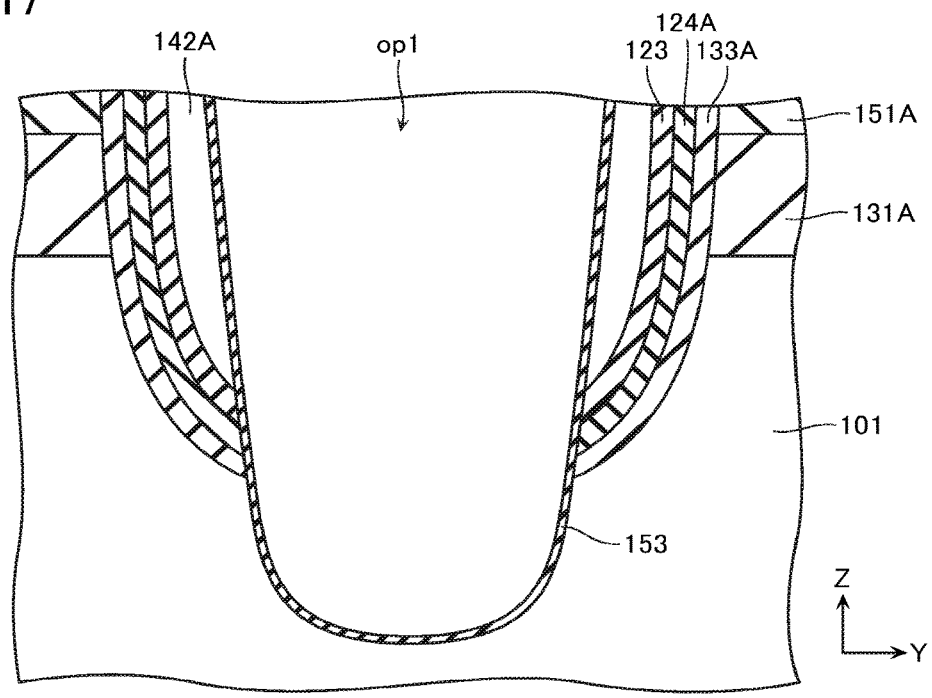
FIG. 17 is a cross-sectional view showing the same method of manufacturing.
Figure 18:
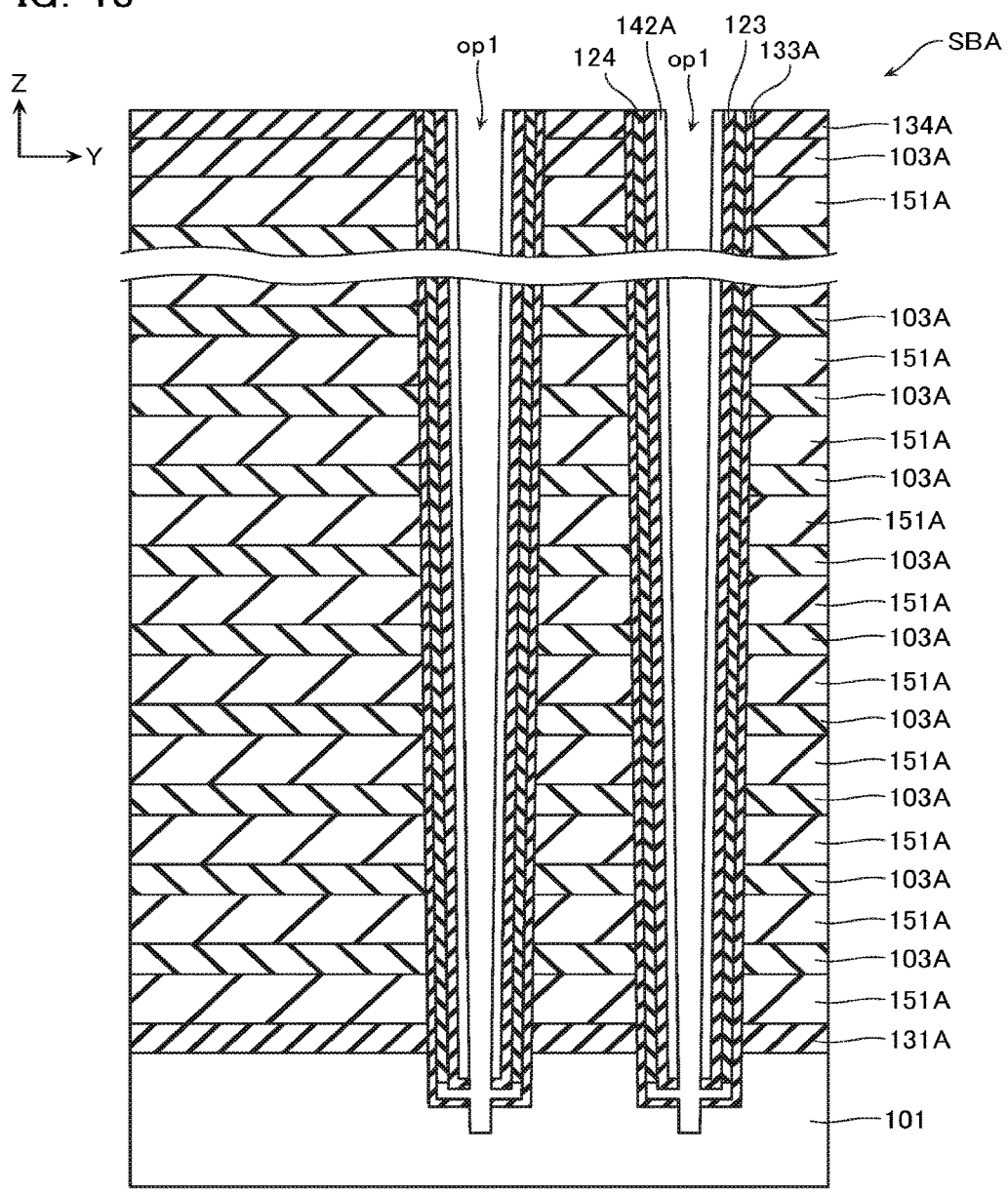
FIG. 18 is a cross-sectional view showing the same method of manufacturing.

As shown in FIG. 9 and FIGS. 15 to 17, in step S104, portions positioned in the bottom portion of the opening op1, of the insulating layer 133A, the charge accumulation layer 124A, the insulating layer 123A, and the semiconductor layer 142A are removed, and an upper surface of the substrate 101 is exposed. As a result, the tunnel insulating layer 123 is formed. Note that as shown in FIG. 17, when the configuration shown in FIGS. 15 and 16 is taken out of a manufacturing device after the present step has been performed, a natural oxide film 153 is sometimes formed on portions exposed in the opening op1, of the substrate 101, the insulating layer 133A, the charge accumulation layer 124A, the tunnel insulating layer 123, and the semiconductor layer 142A.

Figure 19:
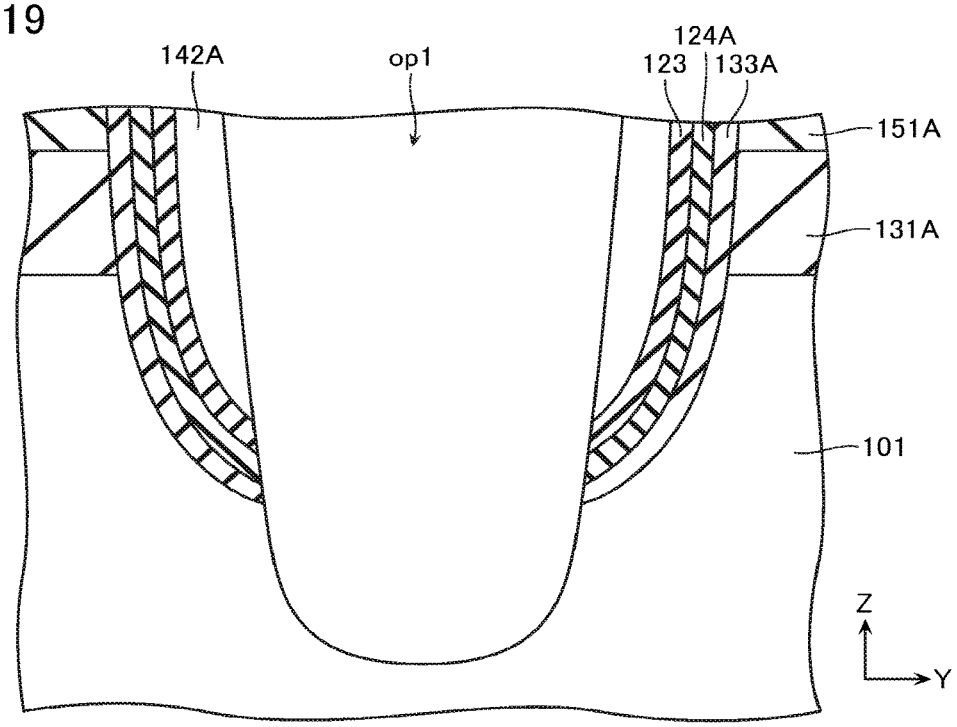
FIG. 19 is a cross-sectional view showing the same method of manufacturing.

As shown in FIG. 9 and FIGS. 18 to 20, in step S105, part of the charge accumulation layer 124A is selectively removed to form the charge accumulation layer 124. For example, first, as shown in FIG. 19, the natural oxide film 153 is removed to expose the substrate 101, the insulating layer 133A, the charge accumulation layer 124A, the tunnel insulating layer 123, and the semiconductor layer 142A. This step may be performed by a means such as COR (Chemical Oxide Removal), for example.

Figure 20:
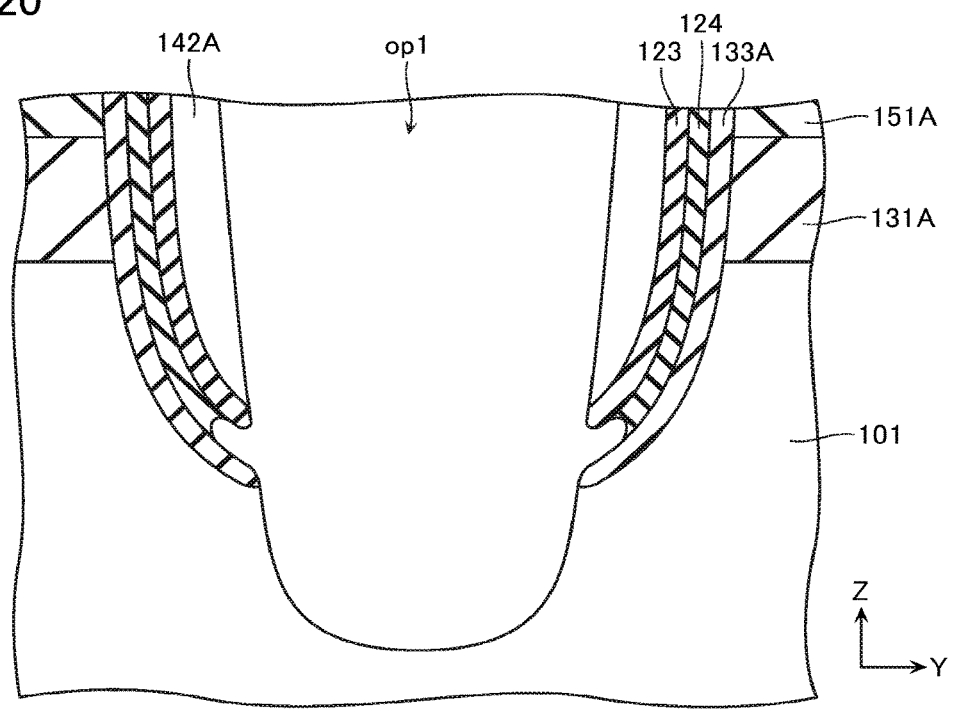
FIG. 20 is a cross-sectional view showing the same method of manufacturing.

Next, as shown in FIG. 20, part of the charge accumulation layer 124A is selectively removed to recess a lower end portion of the charge accumulation layer 124A with respect to lower end portions of the tunnel insulating layer 123 and the insulating layer 133A, and thereby form the charge accumulation layer 124. This step is performed under such a condition that part of the charge accumulation layer 124A is removed faster than the tunnel insulating layer 123 and the insulating layer 133A. For example, in the present embodiment, the charge accumulation layer 124A is formed from silicon nitride, and the tunnel insulating layer 123 and insulating layer 133A are formed from silicon oxide. Therefore, the present step is conceivably performed by the likes of dry etching employing a gas of hydrofluoric acid or wet etching employing the likes of phosphoric acid, for example.

Figure 21:
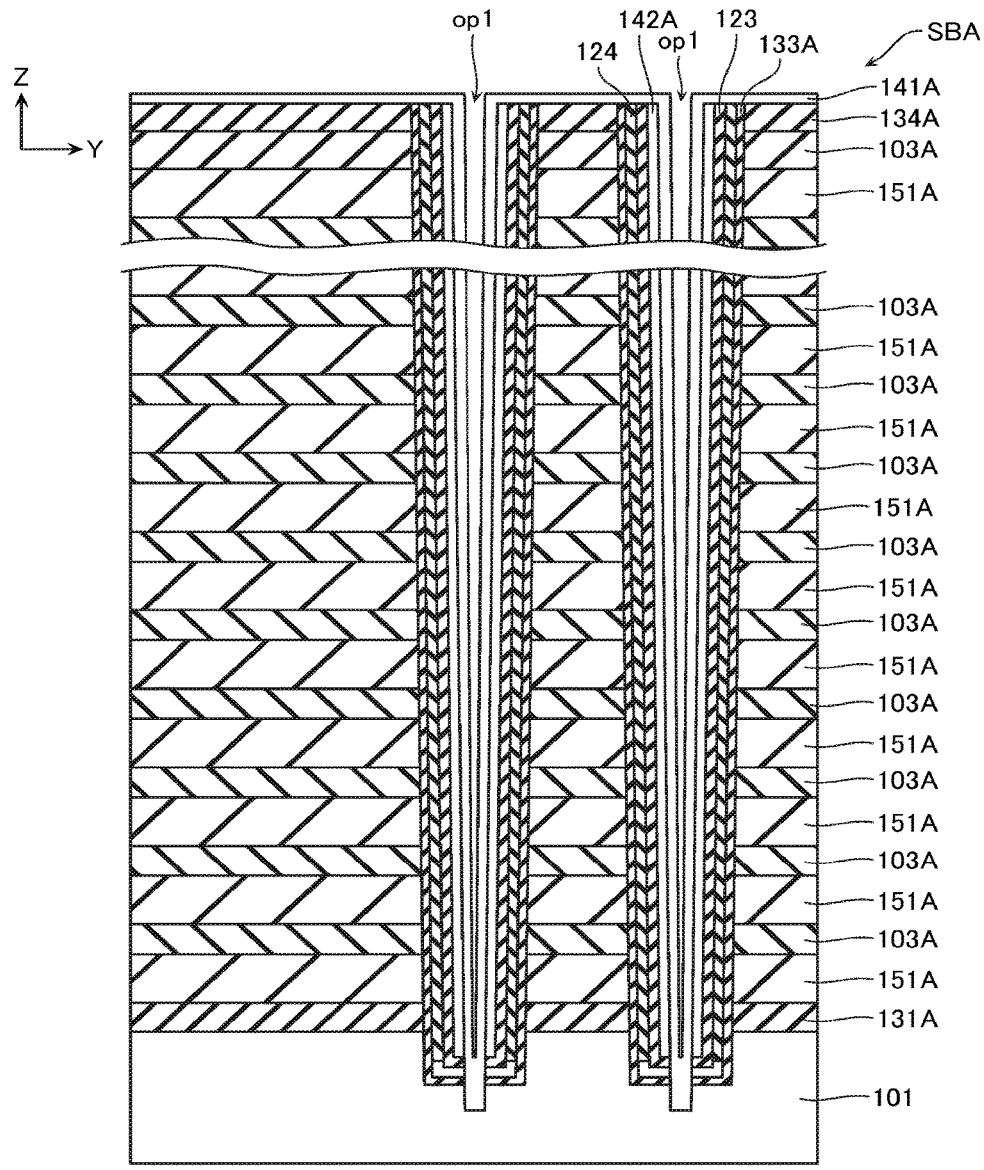
FIG. 21 is a cross-sectional view showing the same method of manufacturing.

As shown in FIG. 9 and FIGS. 21 to 25, in step S106, the semiconductor layer 122 functioning as the channel body of the memory cell MC, and so on, is formed. For example, first, as shown in FIG. 21, a semiconductor layer 141A configuring the first semiconductor layer 141 is formed. The semiconductor layer 141A is formed by an LP-CVD method, for example. In this case, an atom configuring the semiconductor layer 141A (for example, a silicon atom) is adsorbed with comparative ease in the likes of silicon, and is adsorbed with comparative difficulty in the likes of silicon oxide or silicon nitride.

Figure 22:
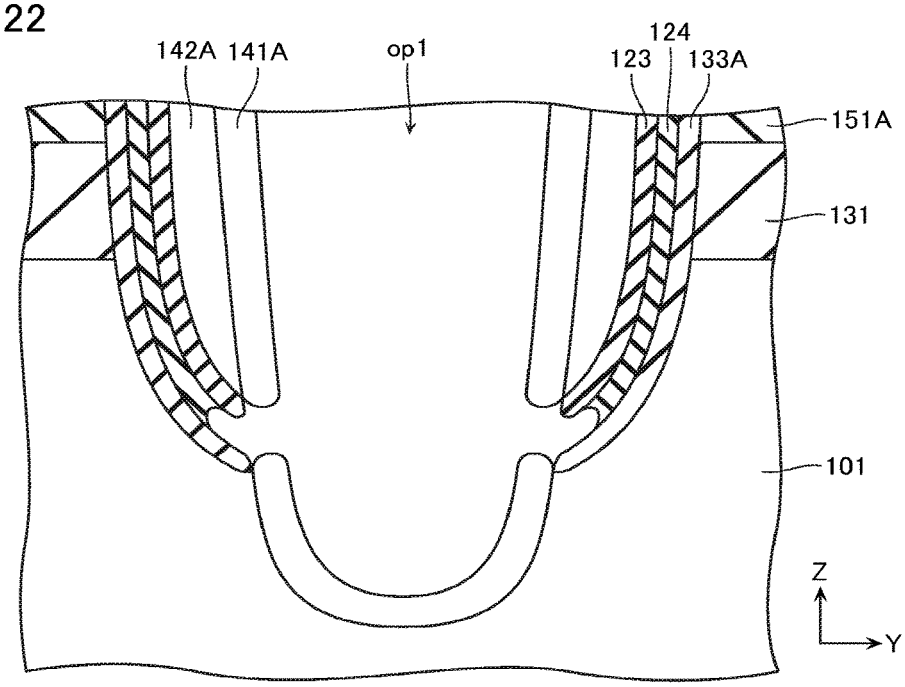
FIG. 22 is a cross-sectional view showing the same method of manufacturing.

Now, as described with reference to FIG. 19, in the present embodiment, the natural oxide film 153 is removed, and the substrate 101, the insulating layer 133A, the charge accumulation layer 124, the tunnel insulating layer 123, and the semiconductor layer 142A are exposed in the opening op1. Therefore, as shown in FIG. 22, in an initial stage of formation, the semiconductor layer 141A is formed on sidewalls of the substrate 101 formed from monocrystals of silicon or the semiconductor layer 142A formed from amorphous silicon. In contrast, the semiconductor layer 141A is not formed on sidewalls of the tunnel insulating layer 123 and insulating layer 133A formed from silicon oxide and the charge accumulation layer 124 formed from silicon nitride. Moreover, as shown in FIG. 22, the semiconductor layer 141A grows so as to cover the lower end portions of the tunnel insulating layer 123, the charge accumulation layer 124, and the insulating layer 133A.

Figure 23:
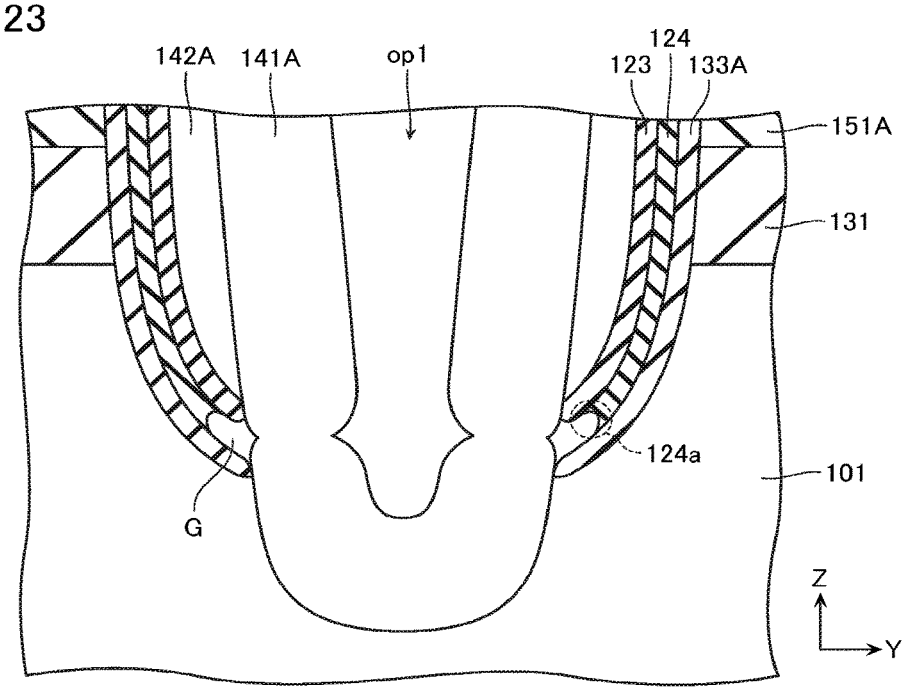
FIG. 23 is a cross-sectional view showing the same method of manufacturing.

As shown in FIG. 23, when film deposition of the semiconductor layer 141A proceeds, the semiconductor layer 141A is formed also on side surfaces of the tunnel insulating layer 123 and insulating layer 133A formed from silicon oxide. However, as shown in FIG. 23, the lower end portion 124a of the charge accumulation layer 124 is recessed with respect to the lower end portions of the tunnel insulating layer 123 and the insulating layer 133A, and has difficulty in contacting a as for forming the semiconductor layer 141A, and so on. Moreover, the semiconductor layer 141A continues growth so as to cover the lower end portions of the tunnel insulating layer 123, the charge accumulation layer 124, and the insulating layer 133A, and spatially divides between the lower end portion 124a of the charge accumulation layer 124 and the opening op1. As a result, the gap G is formed between the charge accumulation layer 124 and the semiconductor layer 141A.

Figure 24:
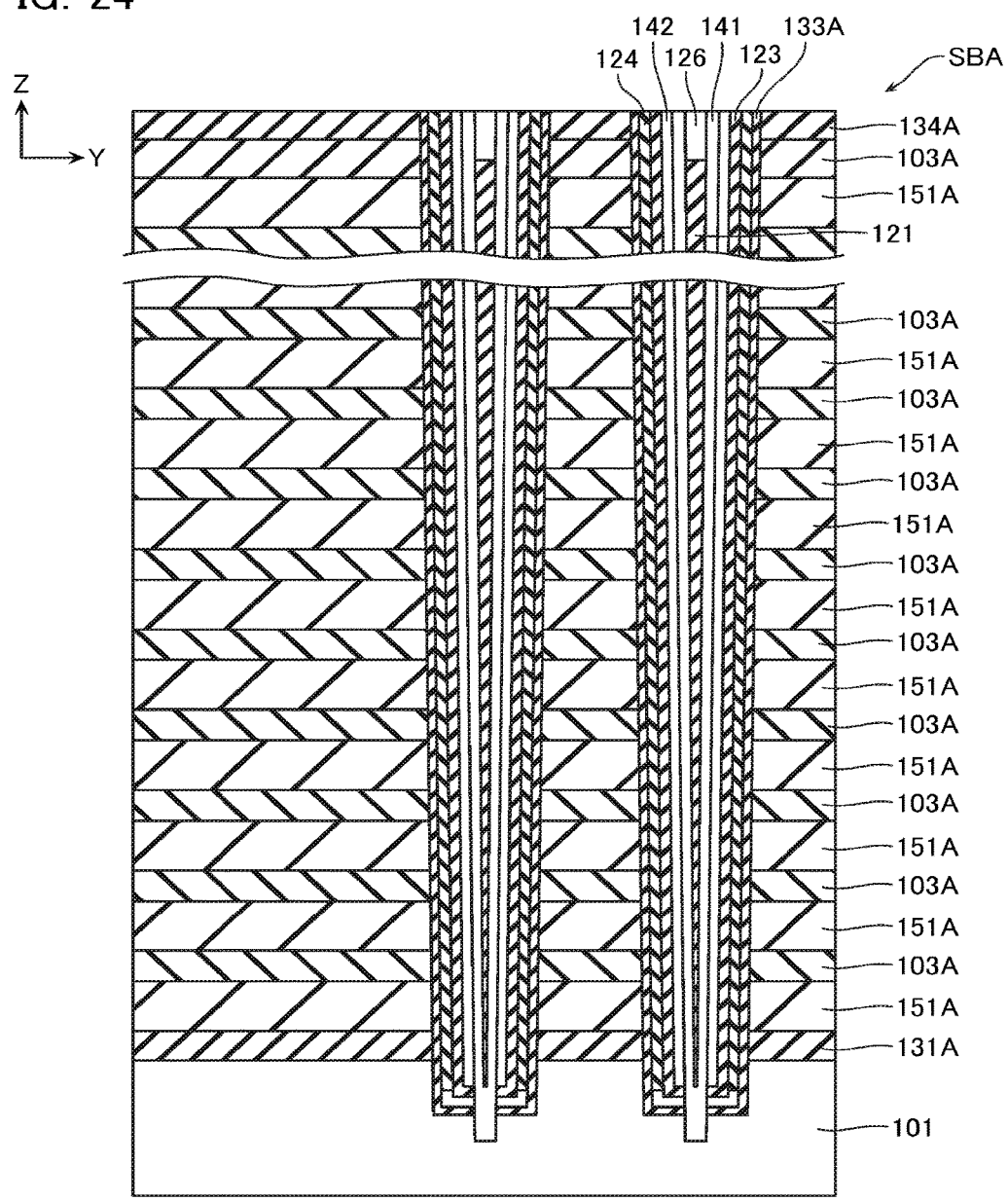
FIG. 24 is a cross-sectional view showing the same method of manufacturing.
Figure 25:
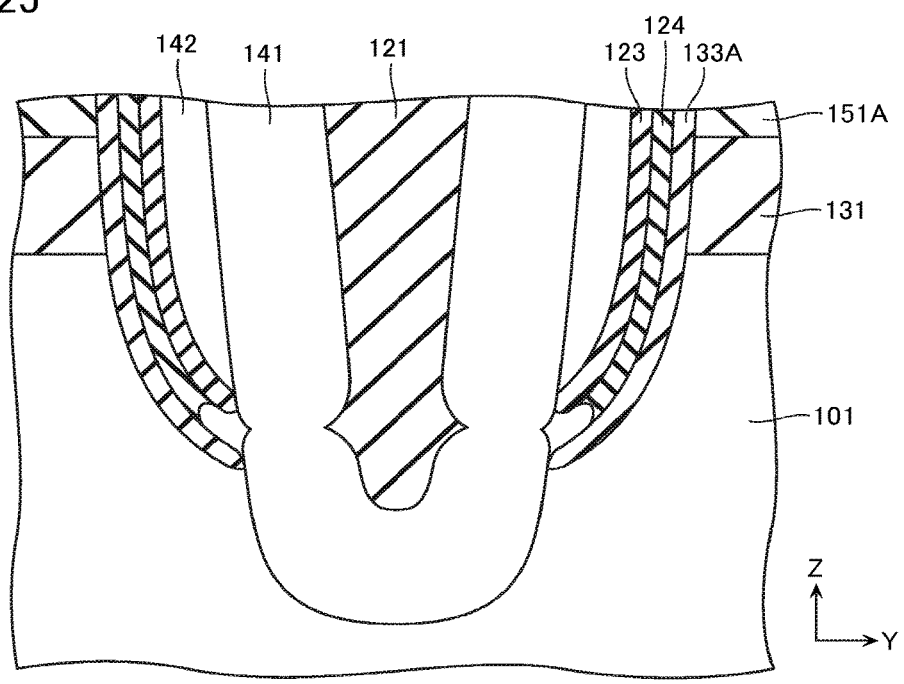
FIG. 25 is a cross-sectional view showing the same method of manufacturing.

Next, as shown in FIGS. 24 and 25, the core insulating layer 121 and a conductive layer 126 are implanted inside the opening op1, CMP (Chemical Mechanical Polishing) or the like is performed using the insulating layer 134A, and so on, as a stopper, and smoothing is performed. As a result, a portion positioned on the upper surface of the stacked body SBA, of the semiconductor layer 141A is removed. In addition, heat treatment, and so on, is performed and a crystalline structure of the amorphous-state semiconductor layer 142A and semiconductor layer 141A is configured as a polycrystalline structure. As a result, the first semiconductor layer 141 and the second semiconductor layer 142 are formed.

Figure 26:
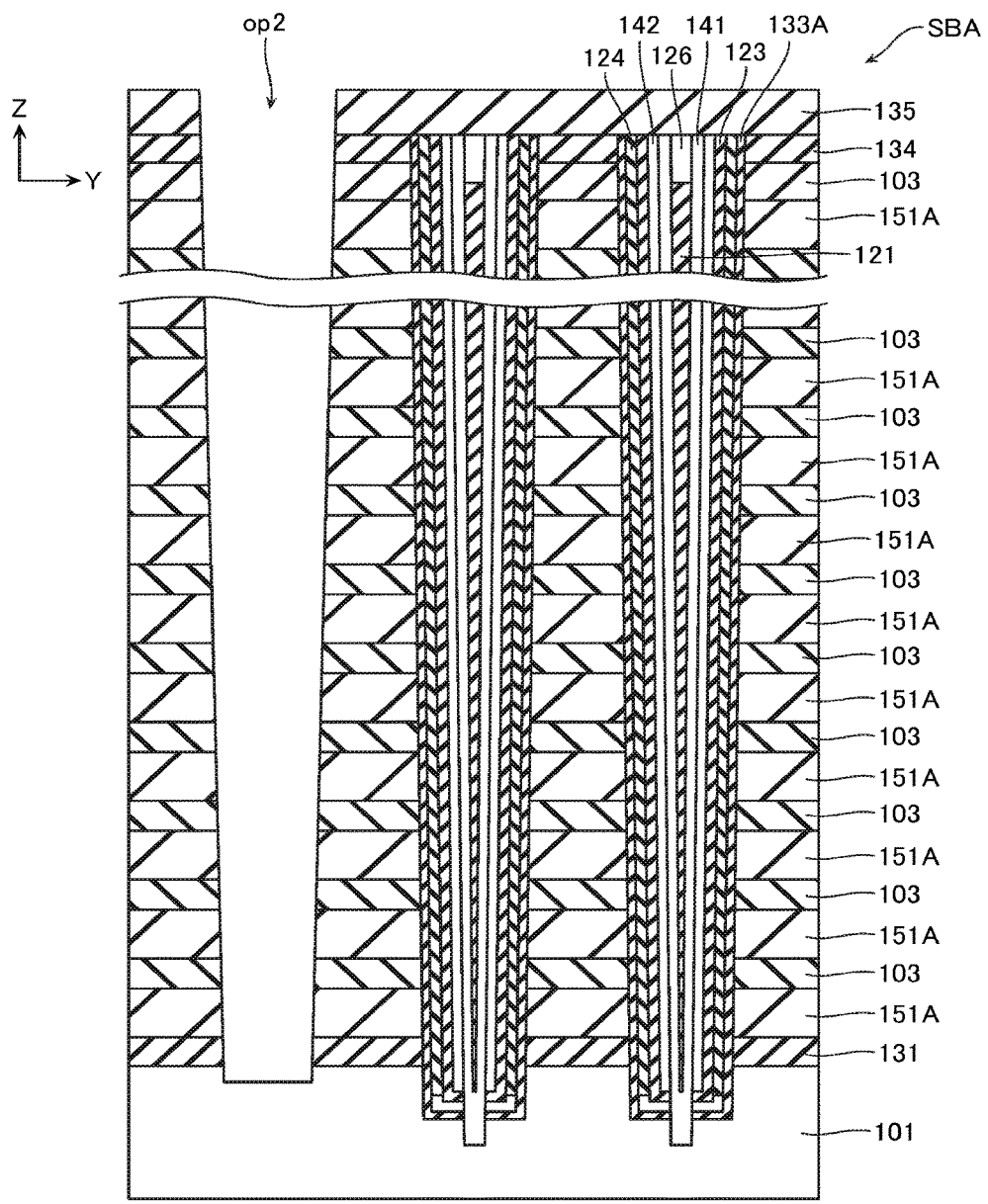
FIG. 26 is a cross-sectional view showing the same method of manufacturing.

As shown in FIGS. 9 and 26, in step S107, a trench op2 that divides at least part of the stacked body SBA, is formed in the stacked body SBA. For example, as shown in FIG. 26, an insulating layer 135 is formed above the upper surface of the stacked body SBA. A portion corresponding to the trench op2, of the insulating layer 135 is provided with a trench having a shape corresponding to the trench op2. Next, anisotropic etching such as RIE is performed using this insulating layer 135 as a mask, and the trench op2 penetrating the stacked body SBA, is formed. As a result, the insulating layer 131, the inter-layer insulating layer 103, and the insulating layer 134 are formed.

Figure 27:
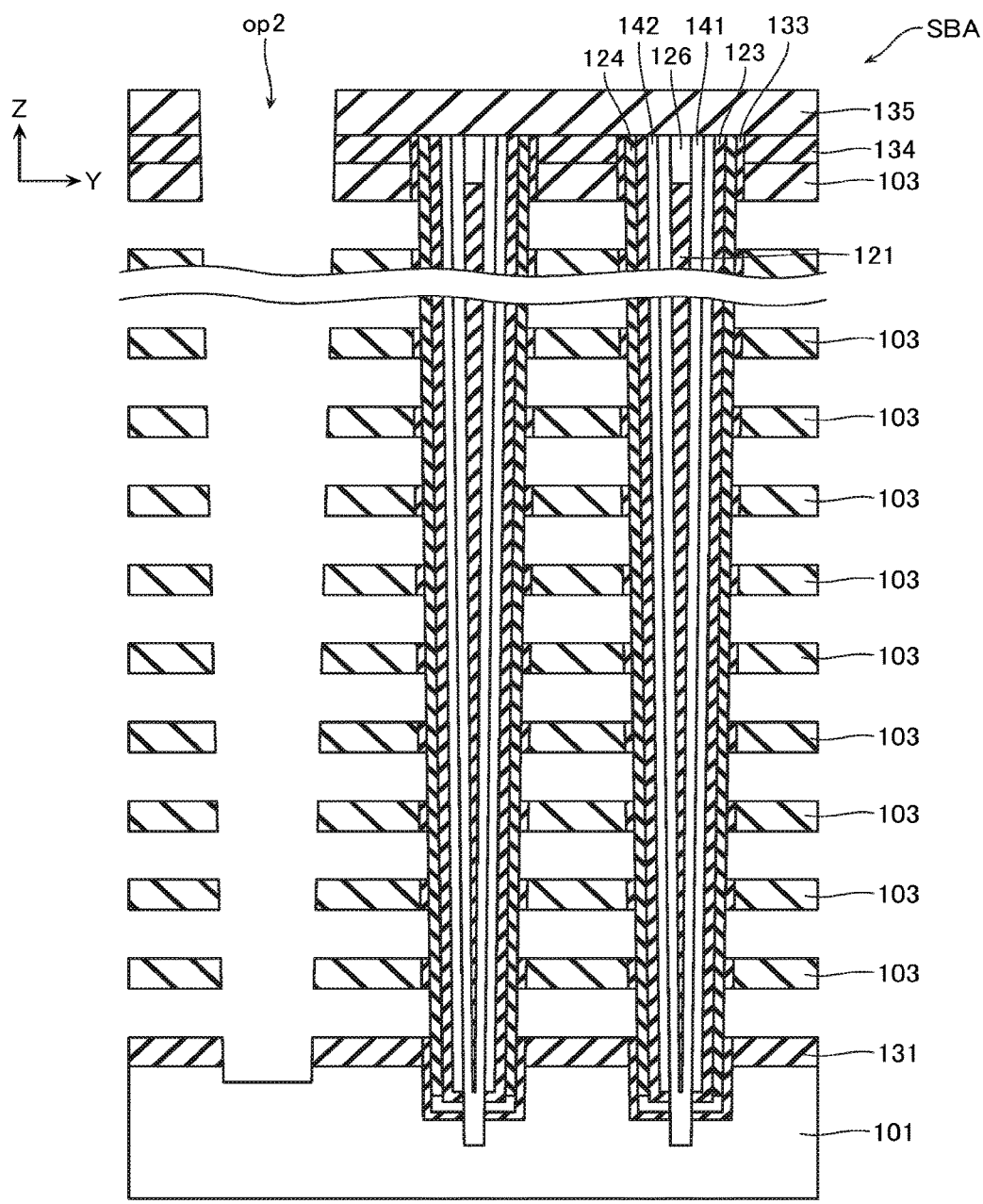
FIG. 27 is a cross-sectional view showing the same method of manufacturing.

As shown in FIG. 9 and FIGS. 27 to 29, in step S108, the conductive layer 102 functioning as the control gate electrode of the memory cell MC, and so on, is formed. That is, as shown in FIG. 27, the sacrifice layer 151A is removed via the trench op2 by a means such as dry etching employing a gas of hydrofluoric acid or wet etching employing phosphoric acid. In addition, part of the insulating layer 133A is removed via the trench op2 by a means such as wet etching employing hydrofluoric acid. As a result, the cover insulating layer 133 is formed.

Figure 28:
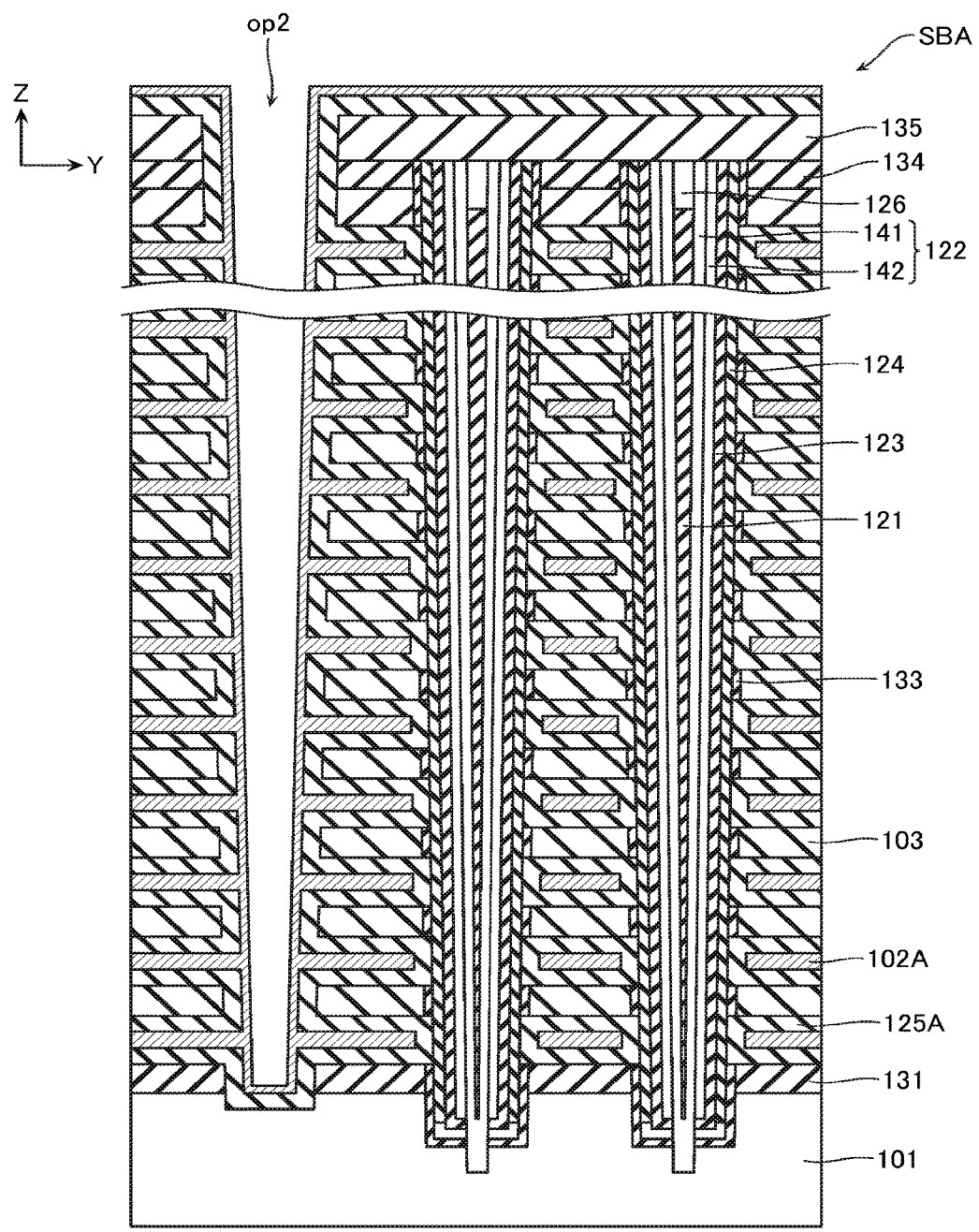
FIG. 28 is a cross-sectional view showing the same method of manufacturing.

Next, as shown in FIG. 28, an insulating layer 125A which will be the block insulating layer 125 is formed, via the trench op2, on an upper surface of the substrate 101, an upper surface, lower surface, and side surface of the inter-layer insulating layer 103, a side surface of the charge accumulation layer 124, and the upper surface of the stacked body SBA. Moreover, a conductive layer 102A which will be the conductive layer 102 is formed in a portion between the inter-layer insulating layers 103 adjacent in a stacking direction.

Figure 29:
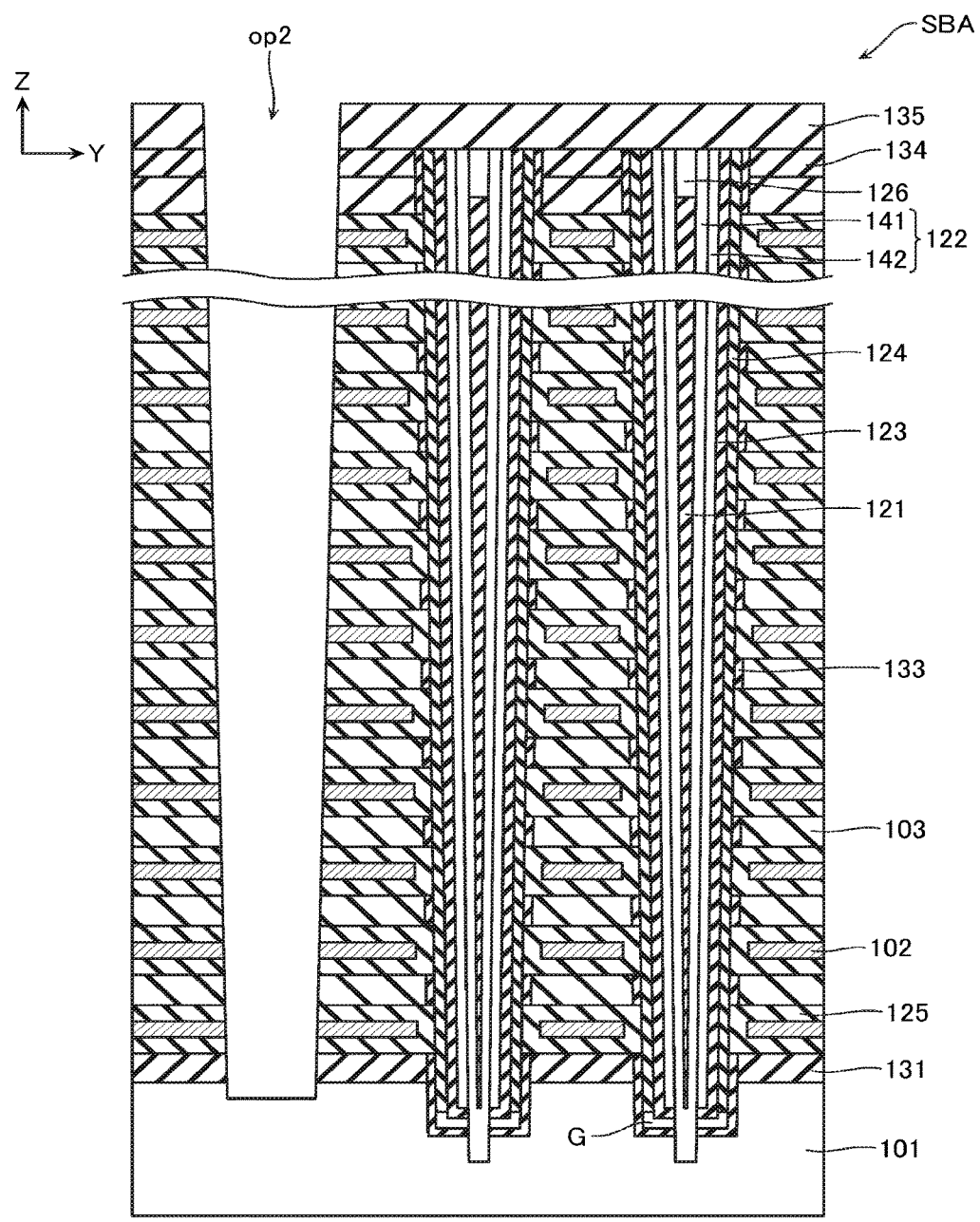
FIG. 29 is a cross-sectional view showing the same method of manufacturing.

Next, as shown in FIG. 29, portions positioned on the upper surface of the substrate 101, portions positioned on the side surface of the inter-layer insulating layer 103, and portions positioned on the upper surface of the stacked body SBA, of the insulating layer 125A and the conductive layer 102A, are removed. As a result, the block insulating layer 125 and the conductive layer 102 divided in the Z direction, are formed.

Subsequently, as shown in FIGS. 9 and 5, in step S109, a spacer insulating layer 136 and the conductive layer 108 are formed, a through hole penetrating the spacer insulating layer 136 and the insulating layer 135 is formed at an upper portion of the memory columnar body 105, and a bit line contact 137 is formed in this through hole. As a result, the nonvolatile semiconductor memory device described with reference to FIG. 5 is manufactured.

Second Embodiment

Figure 30:
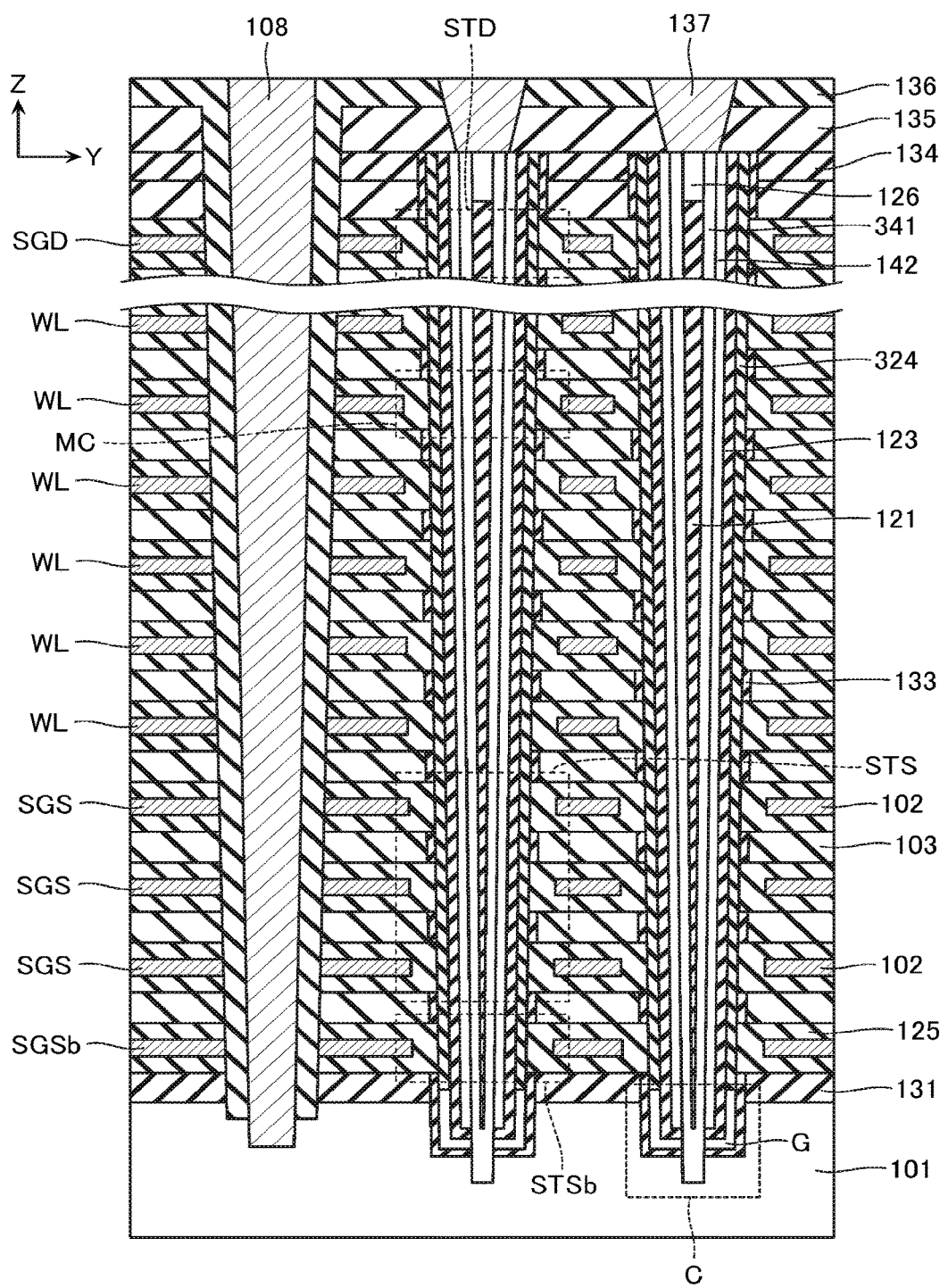
FIG. 30 is a cross-sectional view showing a configuration of part of a nonvolatile semiconductor memory device according to a second embodiment.
Figure 31:
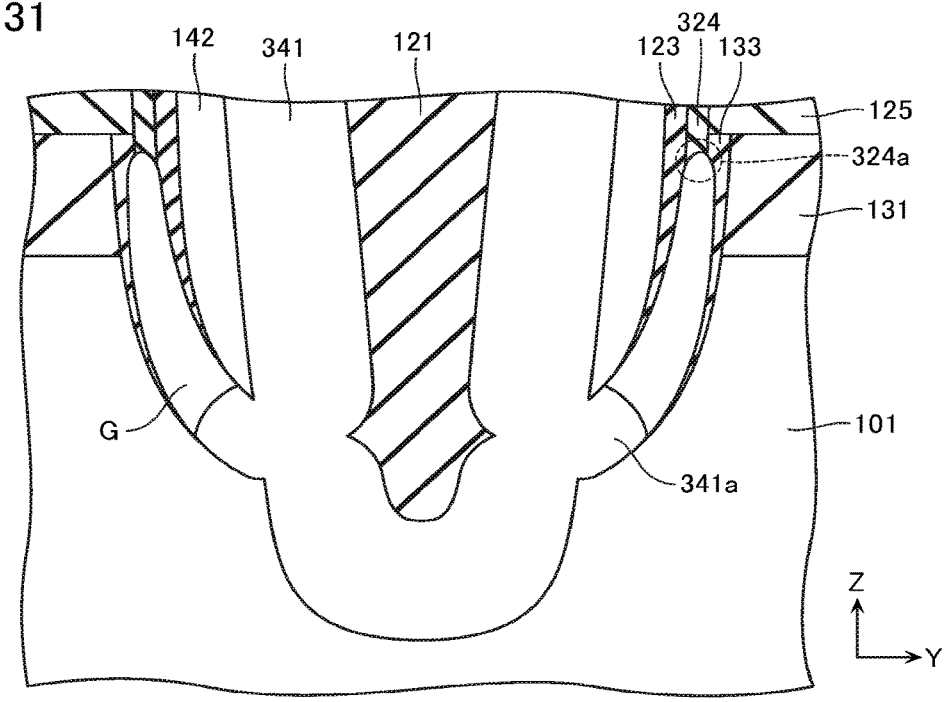
FIG. 31 is a cross-sectional view showing a configuration of part of the same nonvolatile semiconductor memory device.

Next, a configuration of a nonvolatile semiconductor memory device according to a second embodiment will be described with reference to FIGS. 30 and 31. FIG. 30 is a cross-sectional view showing a configuration of part of the same nonvolatile semiconductor memory device. FIG. 31 is a cross-sectional view showing a configuration of part of the same nonvolatile semiconductor memory device, and shows an enlarged view of the portion indicated by C of FIG. 30. Note that in the description below, portions similar to those of the nonvolatile semiconductor memory device according to the first embodiment are assigned with identical reference symbols to those assigned in the first embodiment, and descriptions thereof will be omitted.

As shown in FIGS. 30 and 31, the nonvolatile semiconductor memory device according to the second embodiment is basically configured similarly to the nonvolatile semiconductor memory device according to the first embodiment, but differs from the nonvolatile semiconductor memory device according to the first embodiment in the following points.

That is, as described with reference to FIG. 6, in the first embodiment, the upper end and the lower end of the gap G were positioned more downwardly than the upper surface of the substrate 101. In contrast, as shown in FIG. 31, in the second embodiment, the upper end of the gap G is provided at a position higher than the upper surface of the substrate 101 and lower than the block insulating layer 125. Therefore, a position of a lower end 324a of a charge accumulation layer 324 according to the present embodiment is also provided at a position higher than the upper surface of the substrate 101 and lower than the block insulating layer 125.

Moreover, as shown in FIG. 31, a first semiconductor layer 341 according to the present embodiment includes a projecting portion 341a that projects toward the gap G. Part of the projecting portion 341a is connected to the substrate 101, and part is exposed in the gap G.

The semiconductor memory device according to the present embodiment can be manufactured by a method of manufacturing substantially similar to the method of manufacturing according to the first embodiment. However, as shown in FIG. 32, when manufacturing the semiconductor memory device according to the present embodiment, in the step described with reference to FIG. 20, of the method of manufacturing according to the first embodiment, part of the charge accumulation layer 124A is removed such that the lower end of the charge accumulation layer 124 is provided at a position higher than the upper surface of the substrate 101 and lower than the sacrifice layer 151A.

Figure 32:
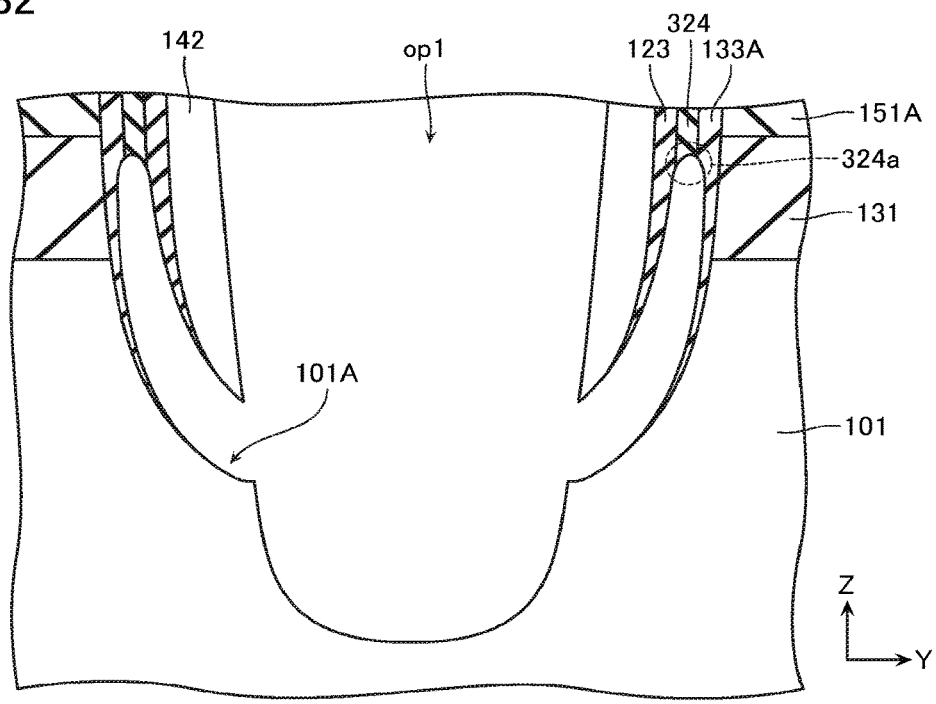
FIG. 32 is a cross-sectional view showing a method of manufacturing the same nonvolatile semiconductor memory device.
Figure 33:
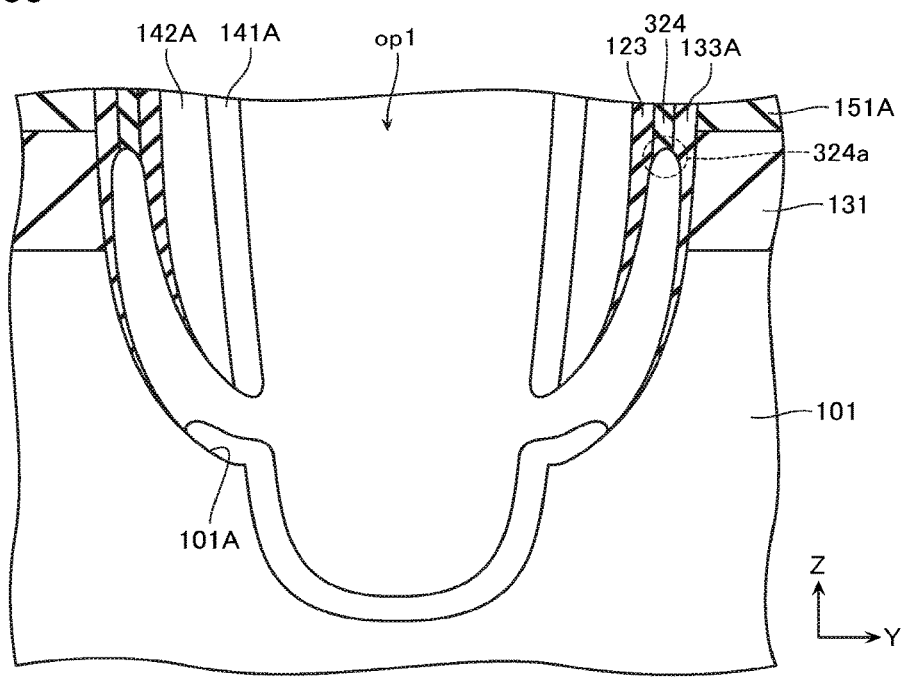
FIG. 33 is a cross-sectional view showing the same method of manufacturing.

Moreover, as shown in FIG. 32, in the method of manufacturing according to the present embodiment, part of the charge accumulation layer 124A is removed such that the lower end of the charge accumulation layer 124 is provided at a position higher than the upper surface of the substrate 101. In such a case, sometimes, for example, a lower end portion of the insulating layer 133A also gets removed, and a portion 101A covered by the insulating layer 133A, of the substrate 101 gets exposed. In such a case, sometimes, as shown in FIG. 33, in the step described with reference to FIG. 22, this portion 101A also has the semiconductor layer 141A formed thereon, and has the protruding portion 341a of the first semiconductor layer 341 formed thereon.

Third Embodiment

Figure 34:
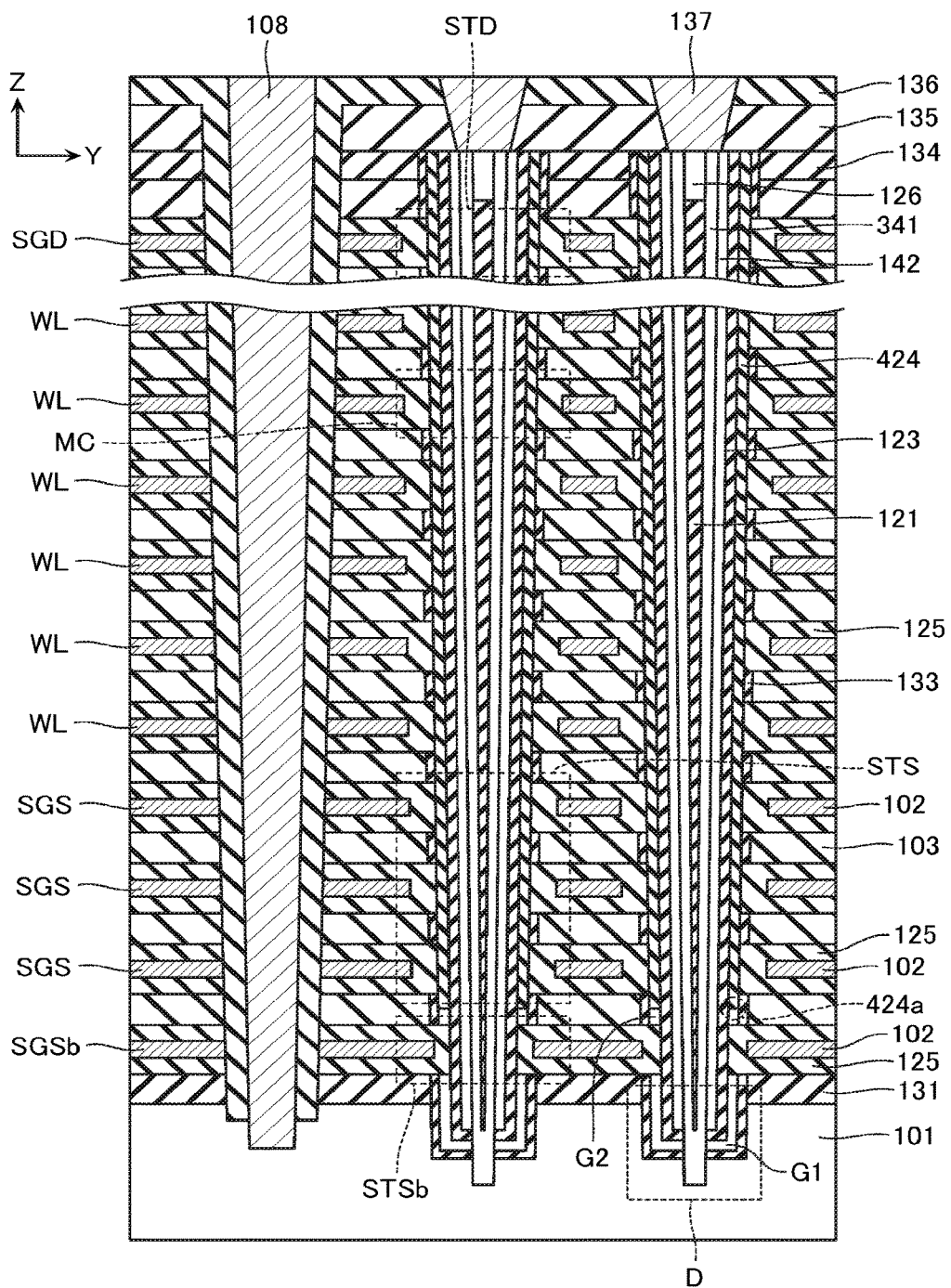
FIG. 34 is a cross-sectional view showing a configuration of part of a nonvolatile semiconductor memory device according to a third embodiment.
Figure 35:
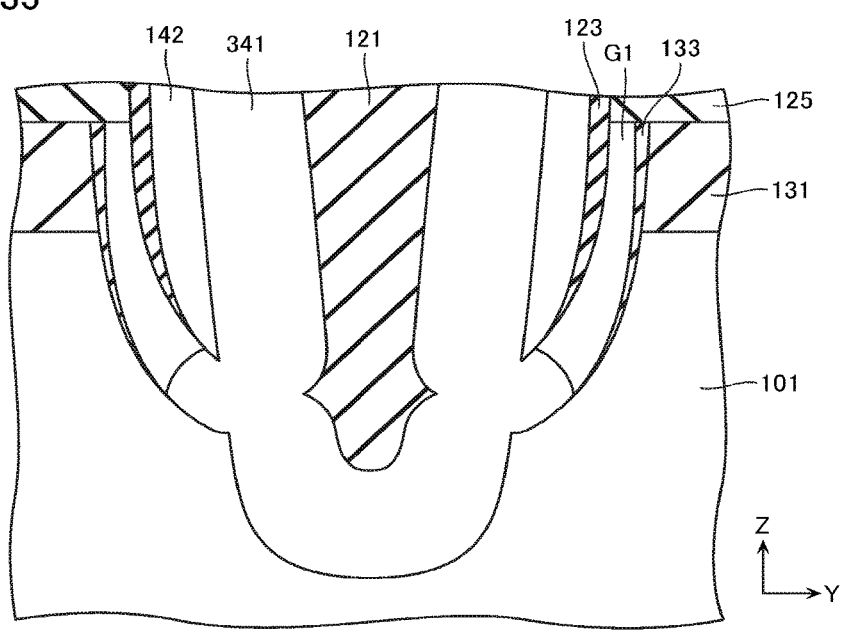
FIG. 35 is a cross-sectional view showing a configuration of part of the same nonvolatile semiconductor memory device.

Next, a configuration of a nonvolatile semiconductor memory device according to a third embodiment will be described with reference to FIGS. 34 and 35. FIG. 34 is a cross-sectional view showing a configuration of part of the same nonvolatile semiconductor memory device. FIG. 35 is a cross-sectional view showing a configuration of part of the same nonvolatile semiconductor memory device, and shows an enlarged view of the portion indicated by D of FIG. 34. Note that in the description below, portions similar to those of the nonvolatile semiconductor memory device according to the second embodiment are assigned with identical reference symbols to those assigned in the second embodiment, and descriptions thereof will be omitted.

As shown in FIGS. 34 and 35, the nonvolatile semiconductor memory device according to the third embodiment is basically configured similarly to the nonvolatile semiconductor memory device according to the second embodiment, but differs from the nonvolatile semiconductor memory device according to the second embodiment in the following points.

That is, as shown in FIG. 34, in the present embodiment, a lower end 424a of a charge accumulation layer 424 is provided more upwardly than some of the conductive layers 102. Moreover, in the present embodiment, the block insulating layer 125 covering this conductive layer 102 contacts the tunnel insulating layer 123. Moreover, in the present embodiment, a gap between the first semiconductor layer 341 and the lower end of the charge accumulation layer 424 is divided into a first gap G1 and a second gap G2 by this block insulating layer 125.

Now, as shown in FIG. 34, in the nonvolatile semiconductor memory device according to the present embodiment, the lower end 424a of the charge accumulation layer 424 is provided more upwardly than some of the conductive layers 102. Moreover, such a conductive layer 102 faces the second semiconductor layer 142 via the block insulating layer 125 and the tunnel insulating layer 123. Therefore, a transistor formed in such a portion has a distance between its channel body and control gate electrode which is closer and a threshold voltage which is lower, compared to those of the memory cell MC. In the present embodiment, such a transistor is utilized as the lowermost layer source side select gate line SGSb and reduces power consumption of the nonvolatile semiconductor memory device.

Moreover, in the present embodiment, the lowermost layer source side select gate transistor STSb resultantly does not include the charge accumulation layer 424, hence fluctuation in threshold voltage of the lowermost layer source side select gate transistor STSb can be prevented.

The semiconductor memory device according to the present embodiment can be manufactured by a method of manufacturing substantially similar to the method of manufacturing according to the first embodiment. However, when manufacturing the semiconductor memory device according to the present embodiment, in the step described with reference to FIG. 20, of the method of manufacturing according to the first embodiment, part of the charge accumulation layer 124A is removed such that the lower end of the charge accumulation layer 124 is provided at a position higher than an upper surface of the lowermost layer-positioned one of the sacrifice layers 151A and lower than an upper surface of the insulating layer 103 positioned directly above that sacrifice layer 151A.

Fourth Embodiment

Figure 36:
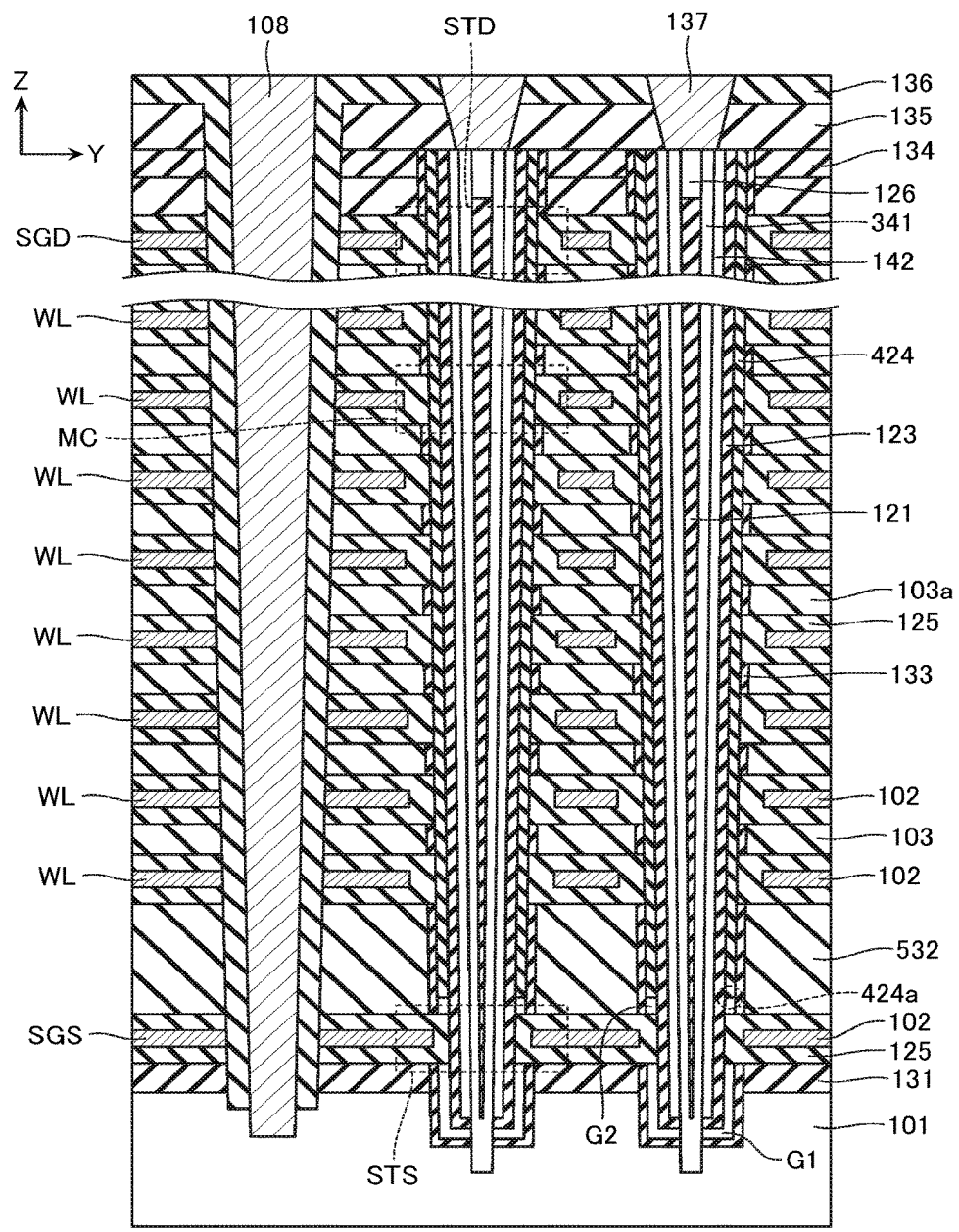
FIG. 36 is a cross-sectional view showing a configuration of part of a nonvolatile semiconductor memory device according to a fourth embodiment.

Next, a configuration of a nonvolatile semiconductor memory device according to a fourth embodiment will be described with reference to FIG. 36. FIG. 36 is a cross-sectional view showing a configuration of part of the same nonvolatile semiconductor memory device. Note that in the description below, portions similar to those of the nonvolatile semiconductor memory device according to the third embodiment are assigned with identical reference symbols to those assigned in the third embodiment, and descriptions thereof will be omitted.

As shown in FIG. 36, the nonvolatile semiconductor memory device according to the fourth embodiment is basically configured similarly to the nonvolatile semiconductor memory device according to the third embodiment, but differs from the nonvolatile semiconductor memory device according to the third embodiment in the following points.

That is, as shown in FIG. 36, the nonvolatile semiconductor memory device according to the present embodiment includes an inter-layer insulating layer 532. The inter-layer insulating layer 532 is formed from the likes of silicon oxide ($SiO_2$), for example. The inter-layer insulating layer 532 has a film thickness larger than that of the inter-layer insulating layer 103. Moreover, in the present embodiment, the lower end 424a of the charge accumulation layer 424 is positioned more downwardly than an upper surface of, and more upwardly than a lower surface of the inter-layer insulating layer 532.

In addition, as shown in FIG. 36, the nonvolatile semiconductor memory device according to the present embodiment does not include the lowermost layer source side select gate transistor STSb, and includes only the source side select gate transistor STS. Moreover, in the third embodiment, a plurality of the conductive layers 102 functioned as the source side select gate line SGS and the control gate of the source side select gate transistor STS, but in the present embodiment, only a single conductive layer 102 positioned in a lowermost layer functions as the source side select gate line SGS and the control gate of the source side select gate transistor STS.

In such an embodiment, the film thickness of the inter-layer insulating layer 532 is larger than the film thickness of the inter-layer insulating layer 103. Therefore, when part of the charge accumulation layer is removed in step S105, the lower end of the charge accumulation layer 424 (upper end of the gap G2) can easily be provided more downwardly than the upper surface of the inter-layer insulating layer 532 and more upwardly than the lower surface of the inter-layer insulating layer 532. Therefore, a margin of a position in a height direction of the lower end portion 424a of the charge accumulation layer 424 can be secured, thereby making it possible for the nonvolatile semiconductor memory device to be manufactured with a good yield.

Fifth Embodiment

Figure 37:
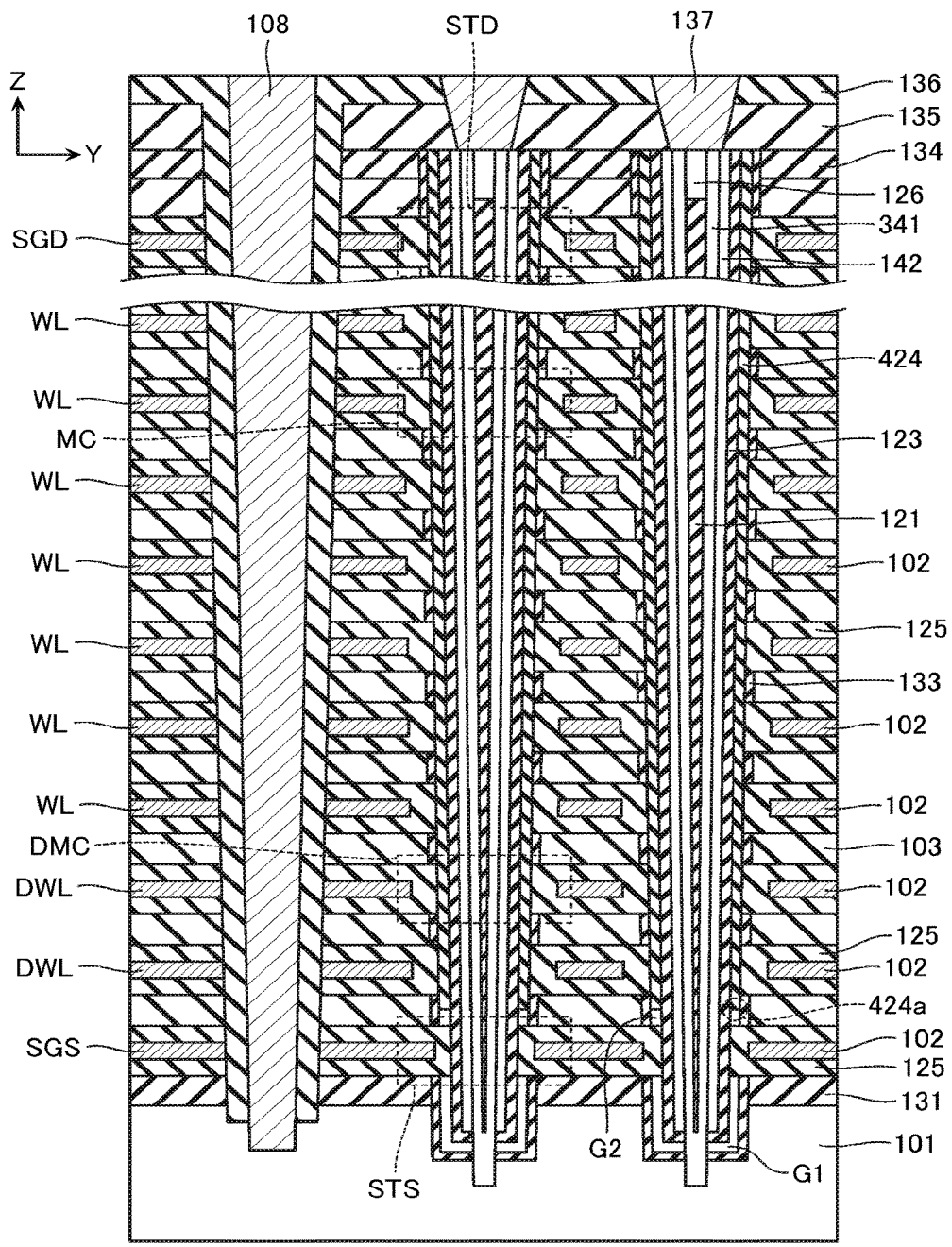
FIG. 37 is a cross-sectional view showing a configuration of part of a nonvolatile semiconductor memory device according to a fifth embodiment.

Next, a configuration of a nonvolatile semiconductor memory device according to a fifth embodiment will be described with reference to FIG. 37. FIG. 37 is a cross-sectional view showing a configuration of part of the same nonvolatile semiconductor memory device. Note that in the description below, portions similar to those of the nonvolatile semiconductor memory device according to the third embodiment are assigned with identical reference symbols to those assigned in the third embodiment, and descriptions thereof will be omitted.

As shown in FIG. 37, the nonvolatile semiconductor memory device according to the fifth embodiment is basically configured similarly to the nonvolatile semiconductor memory device according to the third embodiment, but differs from the nonvolatile semiconductor memory device according to the third embodiment in the following points.

That is, as shown in FIG. 37, the nonvolatile semiconductor memory device according to the present embodiment does not include the lowermost layer source side select gate transistor STSb, and includes only the source side select gate transistor STS. Moreover, in the present embodiment, only a single conductive layer 102 positioned in a lowermost layer functions as the source side select gate line SGS and the control gate of the source side select gate transistor STS.

Additionally, as shown in FIG. 37, in the present embodiment, a dummy memory cell DMC is provided between the plurality of memory cells MC and the source side select gate transistor STS. Moreover, some of the conductive layers 102 function as a control gate electrode of this dummy memory cell DMC and as a dummy word line DWL.

Moreover, as shown in FIG. 37, in the present embodiment, a height of the lower end 424a of the charge accumulation layer 424 is provided between the source side select gate transistor STS and the memory cell MC.

Now, as mentioned above, the memory cells MC each store a one bit or a multiple bit of data configuring the user data. In contrast, user data is not recorded in the dummy memory cell DMC. Therefore, the dummy memory cell DMC need not include the charge accumulation layer 424.

Therefore, by adjusting conditions for forming the charge accumulation layer 424 such that the lower end of the charge accumulation layer 424 (upper end of the gap G2) is provided between the source side select gate transistor STS and the memory cell MC and furthermore by adjusting the number of dummy memory cells DMC, a margin of a position in a height direction of the lower end portion 424a of the charge accumulation layer 424 can be secured, thereby making it possible for the nonvolatile semiconductor memory device to be manufactured with a good yield.

Moreover, during the read operation, the conductive layer 102 functioning as the control gate electrode of the dummy memory cell DMC, and so on, is applied with a voltage, similarly to the conductive layer 102 functioning as an unselected word line WL. Therefore, the semiconductor layer 122 can be suitably rendered in a conductive state.

Sixth Embodiment

Figure 38:
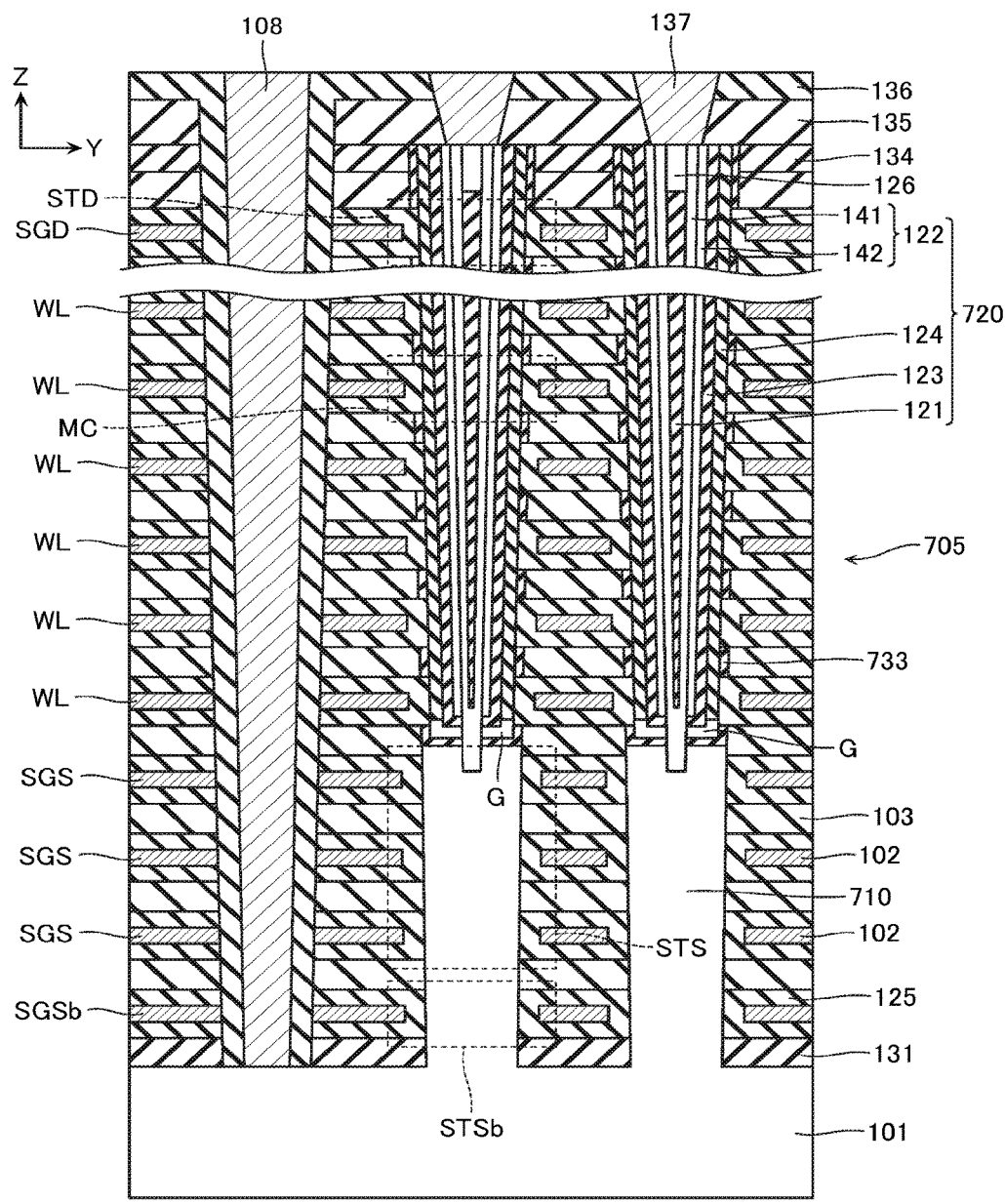
FIG. 38 is a cross-sectional view showing a configuration of part of a nonvolatile semiconductor memory device according to a sixth embodiment.

Next, a configuration of a nonvolatile semiconductor memory device according to a sixth embodiment will be described with reference to FIG. 38. FIG. 38 is a cross-sectional view showing a configuration of part of the same nonvolatile semiconductor memory device. Note that in the description below, portions similar to those of the nonvolatile semiconductor memory device according to the first embodiment are assigned with identical reference symbols to those assigned in the first embodiment, and descriptions thereof will be omitted.

As shown in FIG. 38, the nonvolatile semiconductor memory device according to the sixth embodiment is basically configured similarly to the nonvolatile semiconductor memory device according to the first embodiment, but differs from the nonvolatile semiconductor memory device according to the first embodiment in the following points.

That is, as shown in FIG. 38, a memory columnar body 705 according to the present embodiment includes: a first portion 710 which is positioned downwardly; and a second portion 720 which is positioned upwardly. The first portion 710 functions as part of the lowermost layer source side select gate transistor STSb and part of the source side select gate transistor STS. The second portion 720 functions as part of the memory cell MC and part of the drain side select gate transistor STD.

The first portion 710 of the memory columnar body 705 is formed integrally with the substrate 101 and extends in the Z direction from the upper surface of the substrate 101. Moreover, the second portion 720 of the memory columnar body 705 is basically configured similarly to the memory columnar body 105 according to the first embodiment, but differs in being connected to the first portion 710 of the memory columnar body 705, not the upper surface of the substrate 101.

Now, in the present embodiment, the second portion 720 of the memory columnar body 705 is positioned more upwardly than an upper surface of the first portion 710. Therefore, in the present embodiment, the gap G is positioned more upwardly than the upper surface of the substrate 101.

In order to manufacture the nonvolatile semiconductor memory device according to the present embodiment, it is only required to, for example, perform step S101 and step S102 described with reference to FIGS. 10 to 12, form the first portion 710 of the memory columnar body 705 by a means such as a selective epitaxial growth method, and then perform a method of step S103 and subsequent steps.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of control gate electrodes provided as a stack above a substrate;
    a semiconductor layer having as its longitudinal direction a direction crossing the substrate, the semiconductor layer facing the plurality of control gate electrodes; and
    a charge accumulation layer positioned between the control gate electrode and the semiconductor layer,
    a gap being provided between the semiconductor layer and a lower end portion of the charge accumulation layer.

2. The semiconductor memory device according to claim 1, further comprising:
    a first insulating layer covering a sidewall of the semiconductor layer; and
    a second insulating layer covering a sidewall of the charge accumulation layer,
    wherein the lower end portion of the charge accumulation layer has a recess portion which is recessed with respect to lower end portions of the first insulating layer and the second insulating layer.

3. The semiconductor memory device according to claim 1, further comprising
    a first insulating layer provided between the semiconductor layer and the charge accumulation layer,
    wherein a distance, via the gap, between the semiconductor layer and the lower end portion of the charge accumulation layer, when converted to an electrical resistance value, is not less than a distance equivalent to a film thickness of the first insulating layer.

4. The semiconductor memory device according to claim 1, wherein
    a lower end of the gap is positioned more downwardly than an upper surface of the substrate.

5. The semiconductor memory device according to claim 1, comprising:
    a memory string including a plurality of memory cells connected in series; and
    a select gate transistor electrically connected to one end of the memory string,
    wherein the plurality of control gate electrodes include:
    a first control gate electrode functioning as a control gate electrode of the select gate transistor; and
    a second control gate electrode positioned upwardly of the first control gate electrode and functioning as a control gate electrode of the memory cell, and
    a lower end of the charge accumulation layer is provided more downwardly than the second control gate electrode.

6. The semiconductor memory device according to claim 5, wherein
    the plurality of control gate electrodes include a plurality of the second control gate electrodes,
    and further comprising:
    a first inter-layer insulating layer provided between the plurality of second control gate electrodes; and
    a second inter-layer insulating layer provided between the first control gate electrode and the second control gate electrode, wherein the second inter-layer insulating layer has a film thickness larger than that of the first inter-layer insulating layer, and the lower end of the charge accumulation layer is positioned more downwardly than an upper surface of the second inter-layer insulating layer.

7. The semiconductor memory device according to claim 5, further comprising a dummy memory cell provided between the memory cell and the select gate transistor, wherein the plurality of control gate electrodes include a third control gate electrode positioned between the first control gate electrode and the second control gate electrode, and functioning as a control gate electrode of the dummy memory cell.

8. A semiconductor memory device, comprising:

a plurality of control gate electrodes provided as a stack above a substrate;

a semiconductor layer having as its longitudinal direction a direction crossing the substrate, the semiconductor layer facing the plurality of control gate electrodes;

a first insulating layer covering a side surface of the semiconductor layer;

a charge accumulation layer covering a side surface of the first insulating layer; and a second insulating layer covering a side surface of the charge accumulation layer, a lower end portion of the charge accumulation layer having a recess portion which is recessed with respect to lower end portions of the first insulating layer and the second insulating layer.

9. The semiconductor memory device according to claim 8, wherein the semiconductor layer and the lower end portion of the charge accumulation layer, when converted to an electrical resistance value, are separated by not less than a distance equivalent to a film thickness of the first insulating layer.

10. The semiconductor memory device according to claim 8, comprising:

a memory string including a plurality of memory cells connected in series; and a select gate transistor electrically connected to one end of the memory string, wherein the plurality of control gate electrodes include:

a first control gate electrode functioning as a control gate electrode of the select gate transistor; and a second control gate electrode positioned upwardly of the first control gate electrode and functioning as a control gate electrode of the memory cell, and a lower end of the charge accumulation layer is provided more downwardly than the second control gate electrode.

11. The semiconductor memory device according to claim 10, wherein the plurality of control gate electrodes include a plurality of the second control gate electrodes, and further comprising:

a first inter-layer insulating layer provided between the plurality of second control gate electrodes; and a second inter-layer insulating layer provided between the first control gate electrode and the second control gate electrode, wherein the second inter-layer insulating layer has a film thickness larger than that of the first inter-layer insulating layer, and the lower end of the charge accumulation layer is positioned more downwardly than an upper surface of the second inter-layer insulating layer.

12. The semiconductor memory device according to claim 10, further comprising a dummy memory cell provided between the memory cell and the select gate transistor, wherein the plurality of control gate electrodes include a third control gate electrode positioned between the first control gate electrode and the second control gate electrode, and functioning as a control gate electrode of the dummy memory cell.

* * * * *